United States Patent [19]
Denes et al.

[11] Patent Number: 5,534,232
[45] Date of Patent: Jul. 9, 1996

[54] APPARATUS FOR REACTIONS IN DENSE-MEDIUM PLASMAS

[75] Inventors: Ferencz S. Denes; Raymond A. Young, both of Madison, Wis.

[73] Assignee: Wisconsin Alumini Research Foundation, Madison, Wis.

[21] Appl. No.: 289,621

[22] Filed: Aug. 11, 1994

[51] Int. Cl.$^6$ .................................................. B01J 19/08
[52] U.S. Cl. .............................. 422/186.26; 422/186.22; 422/186.04; 422/906
[58] Field of Search .................... 422/186.22, 186.26, 422/186.04, 906; 204/165, 168

[56] References Cited

U.S. PATENT DOCUMENTS

| | | | |
|---|---|---|---|
| 3,169,914 | 2/1965 | Young et al. | 204/164 |
| 3,224,952 | 12/1965 | Vialaron | 204/171 |
| 3,332,865 | 7/1967 | Vialaron | 204/171 |
| 3,573,192 | 3/1971 | Bersin et al. | 204/312 |
| 3,607,714 | 9/1971 | Vialaron | 422/186.29 |
| 3,674,666 | 4/1972 | Foster et al. | 204/312 |
| 3,840,750 | 10/1974 | Davis et al. | 204/164 |
| 3,954,954 | 5/1976 | Davis et al. | 204/164 |
| 4,016,448 | 4/1977 | Nighan et al. | 313/231 |
| 4,566,961 | 1/1986 | Diaz et al. | 204/168 |
| 4,605,626 | 8/1986 | Beck | 204/403 |
| 4,792,438 | 12/1988 | Horikoshi | 422/186.13 |
| 5,000,831 | 3/1991 | Osawa et al. | 204/173 |
| 5,300,189 | 4/1994 | Kokaku et al. | 156/643 |

FOREIGN PATENT DOCUMENTS 61-73891   4/1986   Japan.

OTHER PUBLICATIONS

"Formation of Polycyclic Aromatic Compounds upon Electric Discharges in Liquid Toluene," Beck, M. T., Dinya, Z., and Keki, S., *Tetrahedron*, vol. 48, No. 23, pp. 4919–4928, 1992. *No month available.

"Oscillatory Kinetics Of the Carbonization Reaction Of Toluene Upon The Effect Of Electric Discharges," *Fullerene Science & Technology*, vol. 1, No. 1, pp. 111–117, 1993. *No month available.

"The Synthesis of Polyacetylene–Type Polymers Under Dense–Medium Plasma Conditions", Simionescu, C. I., Denes, F., Manolache, S. and Badea, C., *Advances in Low-Temperature Plasma Chemistry, Technology, Applications* vol. 3, pp. 35–48, (Mar. 1991).

*Primary Examiner*—John Niebling
*Assistant Examiner*—Kishor Mayekar
*Attorney, Agent, or Firm*—DeWitt Ross & Stevens

[57] ABSTRACT

A method and apparatus for reacting dense-phase chemicals in an induced plasma state, as well as unique reaction products resulting from the method and apparatus, are described. The dense medium plasma reactor generally includes a reaction vessel containing an upper rotatable electrode and a lower static electrode, a device for rotating the upper electrode, a reactant recirculation line, structural elements capable of maintaining the contents of the reaction vessel at atmospheric temperature, and structural elements for cooling the contents of the reaction vessel. Each electrode constitutes a hollow shaft having a first end and a second end which terminates in a disk-shaped planar face. The electrodes are in vertical alignment with one another so that their disc-shaped planar faces are facing one another with a small planar gap located therebetween. The upper rotatable electrode also includes a plurality of ports located circumferentially about its shaft. The method for reacting dense-phase chemicals includes the steps of loading the dense-phase reactant into the reaction vessel, rapidly rotating the upper rotatable electrode, and applying a low voltage direct electric current to the electrode faces. The apparatus and method produce unique reaction products including polyenes, polyynes and fullerene containing materials which exhibit magnetic properties and absorb electromagnetic radiation.

22 Claims, 23 Drawing Sheets

FIG. 8B

| No. | Experimental Exact Masses | % Intensity | Rounded Exp. Integer Values m/z | Theoretical m/z values after splitting 24 - 50 units ||||||
|---|---|---|---|---|---|---|---|---|---|
| | | | | 24 | 25 | 26 | 48 | 49 | 50 |
| 1 | 759.9019 | 28.511 | 760.000 | 736.000 | 735.000 | 734.000 | 712.000 | 711.000 | 710.000 |
| 2 | 753.9536 | 26.089 | 754.000 | 730.000 | 729.000 | 728.000 | 706.000 | 705.000 | 704.000 |
| 3 | 752.9412 | 4.521 | 753.000 | 729.000 | 728.000 | 727.000 | 705.000 | 704.000 | 703.000 |
| 4 | 748.9408 | 16.767 | 749.000 | 725.000 | 724.000 | 723.000 | 701.000 | 700.000 | 699.000 |
| 5 | 747.9613 | 19.749 | 748.000 | 724.000 | 723.000 | 722.000 | 700.000 | 699.000 | 698.000 |
| 6 | 742.9577 | 11.579 | 743.000 | 719.000 | 718.000 | 717.000 | 695.000 | 694.000 | 693.000 |
| 7 | 738.9760 | 13.779 | 739.000 | 715.000 | 714.000 | 713.000 | 691.000 | 690.000 | 689.000 |
| 8 | 735.9681 | 21.708 | 736.000 | 712.000 | 711.000 | 710.000 | 688.000 | 687.000 | 686.000 |
| 9 | 734.9793 | 15.515 | 735.000 | 711.000 | 710.000 | 709.000 | 687.000 | 686.000 | 685.000 |
| 10 | 731.0981 | 26.381 | 731.000 | 707.000 | 706.000 | 705.000 | 683.000 | 682.000 | 681.000 |
| 11 | 730.0288 | 36.034 | 730.000 | 706.000 | 705.000 | 704.000 | 682.000 | 681.000 | 680.000 |
| 12 | 728.0351 | 8.031 | 728.000 | 704.000 | 703.000 | 702.000 | 680.000 | 679.000 | 678.000 |
| 13 | 724.0865 | 18.872 | 724.000 | 700.000 | 699.000 | 698.000 | 676.000 | 675.000 | 674.000 |
| 14 | 721.8751 | 29.135 | 722.000 | 698.000 | 697.000 | 696.000 | 674.000 | 673.000 | 672.000 |
| 15 | 717.9539 | 14.599 | 718.000 | 694.000 | 693.000 | 692.000 | 670.000 | 669.000 | 668.000 |
| 16 | 714.9400 | 39.969 | 715.000 | 691.000 | 690.000 | 689.000 | 667.000 | 666.000 | 665.000 |
| 17 | 707.9552 | 12.698 | 710.000 | 686.000 | 685.000 | 684.000 | 662.000 | 661.000 | 660.000 |
| 18 | 706.9465 | 9.989 | 707.000 | 683.000 | 682.000 | 681.000 | 659.000 | 658.000 | 657.000 |
| 19 | 703.0416 | 100.000 | 703.000 | 679.000 | 678.000 | 677.000 | 655.000 | 654.000 | 653.000 |
| 20 | 696.9505 | 10.593 | 699.000 | 675.000 | 674.000 | 673.000 | 651.000 | 650.000 | 649.000 |
| 21 | 695.9771 | 13.804 | 697.000 | 673.000 | 672.000 | 671.000 | 649.000 | 648.000 | 647.000 |
| 22 | 692.9798 | 1.145 | 696.000 | 672.000 | 671.000 | 670.000 | 648.000 | 647.000 | 646.000 |
| 23 | 682.9649 | 11.350 | 693.000 | 669.000 | 668.000 | 667.000 | 645.000 | 644.000 | 643.000 |
| 24 | 680.9594 | 22.064 | 683.000 | 659.000 | 658.000 | 657.000 | 635.000 | 634.000 | 633.000 |
| 25 | 676.9685 | 4.349 | 681.000 | 657.000 | 656.000 | 655.000 | 633.000 | 632.000 | 631.000 |
| 26 | 668.0024 | 34.895 | 677.000 | 653.000 | 652.000 | 651.000 | 629.000 | 628.000 | 627.000 |
| 27 | 666.0056 | 8.743 | 668.000 | 644.000 | 643.000 | 642.000 | 620.000 | 619.000 | 618.000 |
| 28 | 664.9748 | 3.675 | 666.000 | 642.000 | 641.000 | 640.000 | 618.000 | 617.000 | 616.000 |
| 29 | 661.9974 | 9.315 | 665.000 | 641.000 | 640.000 | 639.000 | 617.000 | 616.000 | 615.000 |
| 30 | 659.9823 | 6.645 | 662.000 | 638.000 | 637.000 | 636.000 | 614.000 | 613.000 | 612.000 |
| 31 | 655.9497 | 10.339 | 660.000 | 636.000 | 635.000 | 634.000 | 612.000 | 611.000 | 610.000 |

| No. | Experimental Exact Masses | % Intensity | Rounded Exp. Integer Values m/z | Theoretical m/z values after splitting 24 - 50 units | | | | | | |
|---|---|---|---|---|---|---|---|---|---|---|
| | | | | 24 | 25 | 26 | 48 | 49 | 50 | |
| 32 | 640.9544 | 14.618 | 656.000 | 632.000 | 631.000 | 630.000 | 608.000 | 607.000 | 606.000 | |
| 33 | 636.0435 | 14.052 | 641.000 | 617.000 | 616.000 | 615.000 | 593.000 | 592.000 | 591.000 | |
| 34 | 630.9563 | 56.425 | 636.000 | 612.000 | 611.000 | 610.000 | 588.000 | 587.000 | 586.000 | |
| 35 | 629.9340 | 14.523 | 631.000 | 607.000 | 606.000 | 605.000 | 583.000 | 582.000 | 581.000 | |
| 36 | 627.0665 | 11.388 | 630.000 | 606.000 | 605.000 | 604.000 | 582.000 | 581.000 | 580.000 | |
| 37 | 627.0190 | 11.604 | 627.000 | 603.000 | 602.000 | 601.000 | 579.000 | 578.000 | 577.000 | |
| 38 | 617.9790 | 12.552 | 618.000 | 594.000 | 593.000 | 592.000 | 570.000 | 569.000 | 568.000 | |
| 39 | 614.9795 | 24.639 | 615.000 | 591.000 | 590.000 | 589.000 | 567.000 | 566.000 | 565.000 | |
| 40 | 605.8399 | 13.162 | 606.000 | 582.000 | 581.000 | 580.000 | 558.000 | 557.000 | 556.000 | |
| 41 | 603.9063 | 12.870 | 604.000 | 580.000 | 579.000 | 578.000 | 556.000 | 555.000 | 554.000 | |
| 42 | 602.9271 | 36.517 | 603.000 | 579.000 | 578.000 | 577.000 | 555.000 | 554.000 | 553.000 | |
| 43 | 597.9332 | 20.347 | 598.000 | 574.000 | 573.000 | 572.000 | 550.000 | 549.000 | 548.000 | |
| 44 | 581.9630 | 16.488 | 582.000 | 558.000 | 557.000 | 556.000 | 534.000 | 533.000 | 532.000 | |
| 45 | 579.9738 | 19.845 | 580.000 | 556.000 | 555.000 | 554.000 | 532.000 | 531.000 | 530.000 | |
| 46 | 579.9342 | 9.818 | 577.000 | 553.000 | 552.000 | 551.000 | 529.000 | 528.000 | 527.000 | |
| 47 | 576.9607 | 16.799 | 566.000 | 542.000 | 541.000 | 540.000 | 518.000 | 517.000 | 516.000 | |
| 48 | 565.9919 | 21.129 | 562.000 | 538.000 | 537.000 | 536.000 | 514.000 | 513.000 | 512.000 | |
| 49 | 561.9846 | 13.518 | 549.000 | 525.000 | 524.000 | 523.000 | 501.000 | 500.000 | 499.000 | |
| 50 | 548.9654 | 8.190 | 548.000 | 524.000 | 523.000 | 522.000 | 500.000 | 499.000 | 498.000 | |
| 51 | 547.9528 | 30.902 | 539.000 | 515.000 | 514.000 | 513.000 | 491.000 | 490.000 | 489.000 | |
| 52 | 538.9681 | 6.804 | 534.000 | 510.000 | 509.000 | 508.000 | 486.000 | 485.000 | 484.000 | |
| 53 | 533.9490 | 4.871 | 532.000 | 508.000 | 507.000 | 506.000 | 484.000 | 483.000 | 482.000 | |
| 54 | 531.9734 | 9.595 | 527.000 | 503.000 | 502.000 | 501.000 | 479.000 | 478.000 | 477.000 | |
| 55 | 536.9682 | 19.222 | 522.000 | 498.000 | 497.000 | 496.000 | 474.000 | 473.000 | 472.000 | |
| 56 | 521.9615 | 13.423 | 518.000 | 494.000 | 493.000 | 492.000 | 470.000 | 469.000 | 468.000 | |
| 57 | 517.9819 | 29.910 | 515.000 | 491.000 | 490.000 | 489.000 | 467.000 | 466.000 | 465.000 | |
| 58 | 514.9044 | 18.942 | 503.000 | 481.000 | 480.000 | 479.000 | 457.000 | 456.000 | 455.000 | |
| 59 | 902.9636 | 18.236 | 499.000 | 479.000 | 478.000 | 477.000 | 455.000 | 454.000 | 453.000 | |
| 60 | 498.9584 | 17.263 | 498.000 | 475.000 | 474.000 | 473.000 | 451.000 | 450.000 | 449.000 | |
| 61 | 497.9587 | 13.149 | 492.000 | 468.000 | 467.000 | 466.000 | 444.000 | 443.000 | 442.000 | |
| 62 | 491.9222 | 14.586 | 491.000 | 467.000 | 466.000 | 465.000 | 443.000 | 442.000 | 441.000 | |

FIG. 8C

| No. | Experimental Exact Masses | % Intensity | Rounded Exp. Integer Values m/z | Theoretical m/z values after splitting 24 - 50 units | | | | | | |
|---|---|---|---|---|---|---|---|---|---|---|
| | | | | 24 | 25 | 26 | 48 | 49 | 50 |
| 63 | 490.8120 | 23.863 | 489.000 | 465.000 | 464.000 | 463.000 | 440.000 | 439.000 | 439.000 |
| 64 | 479.0702 | 46.411 | 479.000 | 455.000 | 454.000 | 453.000 | 431.000 | 430.000 | 429.000 |
| 65 | 476.9906 | 15.515 | 477.000 | 453.000 | 452.000 | 451.000 | 429.000 | 428.000 | 427.000 |
| 66 | 474.9575 | 7.082 | 475.000 | 451.000 | 450.000 | 449.000 | 427.000 | 426.000 | 425.000 |
| 67 | 472.9828 | 17.861 | 473.000 | 449.000 | 448.000 | 447.000 | 425.000 | 424.000 | 423.000 |
| 68 | 471.9826 | 15.833 | 472.000 | 448.000 | 447.000 | 446.000 | 424.000 | 423.000 | 422.000 |
| 69 | 457.9782 | 10.129 | 456.000 | 432.000 | 431.000 | 430.000 | 408.000 | 407.000 | 406.000 |
| 70 | 447.9777 | 16.125 | 445.000 | 421.000 | 420.000 | 419.000 | 397.000 | 396.000 | 395.000 |
| 71 | 441.9575 | 10.975 | 442.000 | 418.000 | 417.000 | 416.000 | 395.000 | 394.000 | 393.000 |
| 72 | 433.9651 | 11.413 | 434.000 | 410.000 | 409.000 | 408.000 | 386.000 | 385.000 | 384.000 |
| 73 | 428.9603 | 94.290 | 429.000 | 405.000 | 404.000 | 403.000 | 381.000 | 380.000 | 379.000 |
| 74 | 421.9703 | 55.700 | 422.000 | 398.000 | 397.000 | 396.000 | 374.000 | 373.000 | 372.000 |
| 75 | 418.9609 | 8.603 | 419.000 | 395.000 | 394.000 | 393.000 | 371.000 | 370.000 | 369.000 |
| 76 | 417.9827 | 8.762 | 418.000 | 394.000 | 393.000 | 392.000 | 370.000 | 369.000 | 368.000 |
| 77 | 403.9849 | 9.150 | 404.000 | 380.000 | 379.000 | 378.000 | 356.000 | 355.000 | 354.000 |
| 78 | 398.9881 | 6.810 | 399.000 | 375.000 | 374.000 | 373.000 | 351.000 | 350.000 | 349.000 |
| 79 | 386.9896 | 21.689 | 387.000 | 363.000 | 362.000 | 361.000 | 339.000 | 338.000 | 337.000 |
| 80 | 379.9975 | 18.014 | 380.000 | 356.000 | 355.000 | 354.000 | 332.000 | 331.000 | 330.000 |
| 81 | 373.9759 | 24.487 | 374.000 | 350.000 | 349.000 | 348.000 | 326.000 | 325.000 | 324.000 |
| 82 | 371.9824 | 7.509 | 372.000 | 348.000 | 347.000 | 346.000 | 324.000 | 323.000 | 322.000 |
| 83 | 368.9785 | 6.384 | 369.000 | 345.000 | 344.000 | 343.000 | 321.000 | 320.000 | 319.000 |
| 84 | 364.9860 | 25.879 | 365.000 | 341.000 | 340.000 | 339.000 | 317.000 | 316.000 | 315.000 |
| 85 | 345.9868 | 16.831 | 346.000 | 322.000 | 321.000 | 320.000 | 298.000 | 297.000 | 296.000 |
| 86 | 321.9836 | 18.904 | 322.000 | 298.000 | 297.000 | 296.000 | 274.000 | 273.000 | 272.000 |
| 87 | 303.9899 | 12.787 | 304.000 | 280.000 | 279.000 | 278.000 | 256.000 | 255.000 | 254.000 |
| 88 | 283.9987 | 8.781 | 284.000 | 260.000 | 259.000 | 258.000 | 236.000 | 235.000 | 234.000 |
| 89 | 267.9836 | 19.444 | 268.000 | 244.000 | 243.000 | 242.000 | 220.000 | 219.000 | 218.000 |
| 90 | 240.9955 | 12.242 | 241.000 | 217.000 | 216.000 | 215.000 | 193.000 | 192.000 | 191.000 |
| 91 | 200.0096 | 11.636 | 200.000 | 176.000 | 175.000 | 174.000 | 152.000 | 151.000 | 150.000 |
| 92 | 158.9868 | 17.314 | 159.000 | 135.000 | 134.000 | 133.000 | 111.000 | 110.000 | 109.000 |
| 93 | 149.0228 | 10.981 | 149.000 | 125.000 | 124.000 | 123.000 | 101.000 | 100.000 | 99.000 |
| 94 | 119.9911 | 59.598 | 120.000 | 96.000 | 95.000 | 94.000 | 72.000 | 71.000 | 70.000 |
| 95 | 111.1182 | 10.002 | 111.000 | 87.000 | 86.000 | 85.000 | 63.000 | 62.000 | 61.000 |
| 96 | 92.9861 | 13.118 | 93.000 | 69.000 | 68.000 | 67.000 | 45.000 | 44.000 | 43.000 |

*FIG. 8D*

BENZAZULENE

BENZENE, 1,1'-(ETHYNEDIYL)BIS- 1,3,- CYCLOPENTADIENE,5.5'-(1-2-ETHANEDIYLIDENE)BIS

BENZENE,(2,4-CYCLOPENTADIEN-1-YLIDENEMETHYL)

ACENAPHTHYLENE,1.2 DIHYDRO- 1,4-ETHENONAPHTALENE, 1,4-DIHYDRO-

1(1-PROPYN-1-YL)-2-PROPYN-1-YL)BENZENE 2.5-ETHENO 4,2,2, PROPELLA-3,7,9-TRIENE

APPARATUS FOR REACTIONS IN DENSE-MEDIUM PLASMAS

This invention was made with U.S. Government support awarded by USDA Grant No. 91-371036546. The United States Government has certain rights in this invention.

FIELD OF THE INVENTION

The present invention relates generally to an apparatus and method for reacting dense-phase chemicals in an induced plasma state. More particularly, the present invention relates to an apparatus and method for chemical synthesis using low temperature plasma chemistry, wherein a reaction vessel having upper and lower electrodes is filled with a dense-medium reactant, the upper electrode is rotated, and an electric current is applied to the faces of the electrode to create the plasma state. The present invention is further directed to the organic reaction products resulting from the inventive apparatus and method, which exhibit unique magnetic properties.

DESCRIPTION OF THE PRIOR ART

The prior art in the field of the invention is essentially all in the area of gas phase plasma reactions for polymerization and modification of solid substrates. For example, U.S. Pat. No. 3,573,192 to Bersin et al., U.S. Pat. Nos. 3,840,750 and to Davies et al., U.S. Pat. No. 4,605,626 to Beck, U.S. Pat. No. 4,016,448 to Nighan et al., U.S. Pat. No. 4,566,961 to Diaz et al., and U.S. Pat. No. 5,000,831 to Osawa et al. all disclose apparata and processes for conducting gas-phase plasma reactions.

The term "plasma" is used to identify gaseous complexes which may comprise electrons, positive or negative ions, gaseous atoms and molecules in the ground state or any higher state of excitation including light quanta. The most common method for achieving a plasma state is through an electrical discharge. Electrical discharge plasmas are either "hot," i.e., thermal, or "cold," i.e., nonthermal.

"Hot" plasmas comprise gas atoms and electrons which are essentially in thermal equilibrium with each other. "Hot" plasmas are produced from electrical arcs, plasma jets, and magnetic fields. "Hot" plasmas produced from electrical arcs and plasma jets require equilibrium conditions in which the gas and electron temperatures are very high ($5\times10^3$K) and nearly identical. As a result, most organic molecules and polymers cannot be treated under these conditions because they would be rapidly degraded.

There are also several disadvantages associated with hot plasma synthesis. One main disadvantage is the need for elevated temperatures of the gas phase and substrate. The elevated temperature requirement limits plasma synthesis to inorganic reactions, limits high molecular weight depositions, and creates a requirement for costly handling equipment due to the high temperatures generated. Other disadvantages include the predominance of decomposition reactions and the production of non-recyclable gas compositions generated from undesired secondary gas phase recombination reactions.

"Cold" plasmas, which are not at thermal equilibrium, comprise gas atoms at room temperature and electrons at much higher temperatures. This plasma state provides an ambient gas temperature along with electrons which have sufficient kinetic energy to cause the cleavage of chemical bonds. As a result, "cold" plasmas are highly suitable for chemical reactions, such as organic synthesis, polymerizations, surface treatments, and grafting reactions, which involve thermally sensitive materials. "Cold" plasmas are characterized by average electron energies of 1–20 electron Volts and electron densities of $10^9$ to $10^{12}$ cm$^{-3}$. There are two types of "cold" plasmas: 1) the low pressure glow types which are produced by alternating current, direct current, or radio frequency discharges; and 2) the high pressure corona type produced at electrodes during a high-voltage discharge.

Glow discharge (low pressure cold plasma) synthesis of polymers has been employed to produce uniform, non-porous thin films of superior physical, chemical and electrical properties. Surface modification of various polymeric materials under cold plasma conditions has also been employed. However, there are a number of disadvantages associated with cold plasma synthesis. The main disadvantages include the necessity to operate at low pressures and the resulting low yields of reaction products, the competitive deposition-ablation reactions resulting in heavily crosslinked, amorphous structures, and the need for static, costly equipment.

Some reactions in dense-medium plasmas have been performed. U.S. Pat. Nos. 3,224,952 and 3,332,865, both to Vialaron, disclose methods and apparata for producing gaseous mixtures containing acetylene and ethylene. These patents describe an invention in which two electrodes are submersed in a liquid hydrocarbon, and an electric arc is produced between the two electrodes. The electric arc is interrupted and then restored in accordance with a predetermined frequency by imparting an alternating movement to at least one of the electrodes which functions to move the electrodes in and out of contact with the arc. However, these references specifically disclose procedures for cracking organic products, such as kerosene and paraffin oil, for generating volatile hydrocarbons such as acetylene, ethylene, and methane based derivatives. The Vialaron patents do not disclose synthesizing liquid and solid phase derivatives from dense-medium plasmas. Further, the procedures employed in the Vialaron patents utilize a high energy arc which is associated with high temperatures. Consequently, thermal energy dominates the reaction mechanisms.

Polycyclic aromatic compounds have been formed through an electrical discharge made in liquid toluene between graphite electrodes. "Formation of Polycyclic Aromatic Compounds upon Electric Discharges in Liquid Toluene," Beck, M. T., Dinya, Z., and Keki, S., *Tetrahedron*, Vol. 48, Number 23, pp. 4919–4928, 1992; "Oscillatory Kinetics Of the Carbonization Reaction Of Toluene Upon The Effect Of Electric Discharges," *Fullerene Science & Technology*, Vol. 1, Number 1, pp. 111–117, 1993. A high number of polycyclic hydrocarbons and fullerenes, $C_{60}$ structures, were synthesized starting with toluene in a direct current discharge and in a high voltage alternating current arc discharge. A low voltage of 24–28 volts was applied to graphite electrodes in the synthesis employing direct current. The graphite electrodes were located approximately 2 mm apart, and the best results were recorded when the electrodes scraped together or scratched one another. Under these conditions, the electrodes themselves took part in the reactions and no formation of $C_{60}$ was observed.

A high voltage of 20 kilo-volts was applied to the electrodes in a double-walled glass reactor synthesis employing alternating current. The double-walled reactor facilitated the cooling of the system and both polycyclic aromatic hydrocarbons and fullerenes were formed. Nevertheless, in both the direct current and alternating current syntheses, no intense and continuous stirring of the toluene was carried out and the graphite electrodes themselves played some part in the reactions.

The synthesis of a polyacetylene-like structure from benzene has been carried out under dense-medium plasma conditions. "The Synthesis of Polyacetylene-Type Polymers Under Dense-Medium Plasma Conditions", Simionescu, C. I., Denes, F., Manolache, S. and Badea, C., *Advances in Low-Temperature Plasma Chemistry, Technology, Applications* Vol. 3, pp. 35–48, (March 1991). A specially designed plasma reaction vessel comprising a rotating superior electrode and a fixed-position interior electrode was utilized for the reaction. The fixed-position interior electrode comprised tunnels to facilitate the recycling of the reaction medium. The reaction medium was forced through the tunnels as a result of the vacuum generated between the electrodes by centrifuging the liquid reactant, namely benzene. However, the reactor configuration and reaction conditions did not yield sufficient product nor produce efficient results.

In summary, plasma reactions utilizing gas phase reactants exhibit limited applicability and limited quantities of product. Further, such plasma reactions of gas phase reactants require low pressure conditions. Solid powder materials have never been successfully reacted with plasma technology known to the art. Static charges and dispersion problems have prevented successful plasma reactions of solid powder materials. Also, limited experimentation with plasma reactions of liquid phase reactants has produced inefficient results which are exemplified by limited quantities of reaction products.

Accordingly, there is a need for an improved method and apparatus for reacting dense-phase (liquid and solid) chemicals in an induced plasma state which efficiently produces sufficient quantities of reaction material. In addition, there is also a need for an improved method and apparatus for reacting dense-phase chemicals in an induced plasma wherein the reaction mechanisms are controlled by electron flux density instead of thermal energy. Finally there is a need for unique reaction products which are formed by an improved method and apparatus for reacting dense-phase chemicals, as previously described, wherein one of such reaction products exhibits intense absorption of high frequency electromagnetic radiation.

SUMMARY OF THE INVENTION

It is a principal object of the present invention to provide a method and apparatus for reacting dense-phase chemicals in an induced plasma state.

It is a further object of the present invention to provide a method and apparatus for carrying out plasma reactions of dense-phase chemicals under atmospheric pressure and low temperatures which results in limited thermal degradation of resulting products.

It is a still further object of the present invention to provide a method and apparatus for reacting dense-phase chemicals wherein an electron flux is developed to induce chemical modifications and cracking reactions.

It is yet a further object of the present invention to provide a method and apparatus for reacting dense-phase chemicals in an induced plasma state which allows for the rapid removal of active species from the chemical reaction site thereby avoiding the development of extensive decomposition reactions.

It is still a further object of the present invention to provide a method and apparatus for carrying out plasma reactions of dense-phase chemicals wherein heterogeneous reactions can occur in the form of simultaneous surface modifications or grafting of dispersed polymeric materials.

It is still a further object of the present invention to provide an easy, convenient, and efficient method and apparatus for reacting dense-phase chemicals in an induced plasma state such that sufficiently large quantities of reaction products are produced.

It is still a further object of the present invention to provide the synthesis of unique reaction products by reacting dense-phase chemicals in an induced plasma state which include polyene, polyyene and polymeric polyradical type structures, carbon cage derivatives such as fullerenes, polymeric structures with specific electrical and magnetic properties, and other new organic materials.

The apparatus for reacting dense-phase chemicals in an induced plasma state generally includes:

(a) a reaction vessel having a first upper end, a second lower end, and side walls to define an enclosed area;

(b) a rotatable first electrode comprising a hollow shaft having first and second ends wherein the first electrode extends through the first end of the reaction vessel such that the second end of the first electrode is positioned near an interior center of the reaction vessel;

(c) a static second electrode comprising a hollow shaft having first and second ends wherein the second electrode extends through the second end of the reaction vessel such that the second end of the second electrode is positioned near an interior center of the reaction vessel; and (d) means for rotating the rotatable first electrode.

The apparatus may further comprise a reactant recirculation line, means for maintaining the contents of the reaction vessel at atmospheric pressure, and means for monitoring and cooling the temperature of the contents contained in the reaction vessel. The upper and lower electrodes are in vertical orientation to one another and each has an electrode face located at approximately the center of the reaction vessel. The electrode faces are oriented in a horizontal plane with a small planar gap located between them. The upper and lower electrodes include a hollow shaft with the upper electrode having circumferential ports which open therethrough and an end opening at the electrode face, and the lower electrode having openings on both of its ends.

A preferred apparatus for reacting dense-phase chemicals in an induced plasma state comprises:

(a) a cylindrical shaped reaction vessel having a first upper end, a second lower end, and double side walls defining a space therebetween;

(b) a rotatable first electrode extending through the first upper end of the reaction vessel and comprising a first cylindrical hollow shaft having a plurality of circumferential ports located therethrough, a first closed end, and a second open end located within the reaction vessel, the second open end terminating in a planar face having a larger diameter than the first cylindrical hollow shaft wherein an opening in the second open end is located in the center of the planar face and has a diameter equal to an internal diameter of the first cylindrical hollow shaft;

(c) a static second electrode extending through the bottom end of the reaction vessel and comprising a second cylindrical hollow shaft having a first open end and a second open end located within the reaction vessel, the second open end terminating in a planar face having a larger diameter than the second cylindrical hollow shaft wherein an opening in the second open end of the second cylindrical hollow shaft is located in the center of the planar face of the second cylindrical hollow shaft and has a diameter equal to an internal diameter of the second cylindrical hollow shaft; and (d) means for rotating the rotatable first electrode.

The method for reacting dense-phase chemicals with the above described apparata includes the basic steps of 1) loading the dense-phase chemical reactants into the reaction vessel, 2) rotating the planar face of the upper electrode contained within the reaction vessel in relation to the planar face of the lower static electrode contained within the reaction vessel, and 3) applying an electric current to the planar electrode faces of the upper and lower electrodes to create the plasma state. The temperature of the system is controlled by using a thermostat and/or a liquid nitrogen cooling system to cool the reactant liquid which is driven through an outside feed-back connection and recirculated into the chamber as a result of the centrifugal force generated by the rotation vessel and the upper and lower electrodes. The system is maintained at atmospheric pressure by introducing a positive supply of gas through the lower electrode shaft and venting the gas blanket formed at the top of the reaction vessel to the atmosphere.

The reaction products which are produced from the method and apparatus for reacting dense-phase chemicals in an induced plasma state exhibit both unique structures and properties. Some of these structures include metal atoms incorporated into organic polymers, polyene and polyyne structures, and polycyclic triple bonds containing hydrocarbons. When using benzene as a reactant in the method and apparatus for reacting dense-phase chemicals in an induced plasma state, the resulting product is a linear or branched chain polymer consisting of carbons linked by double and triple bonds, and hydrogen. The resulting product further contains localized biradicals which give rise to magnetic properties which result in a reaction product which absorbs electromagnetic radiation. Reaction products from the above described method and apparatus also exhibit semiconductivity and photoconductivity. The unique properties of the products may be used for superconductivity applications or radar shielding applications for defense purposes. The inventive method and apparatus for plasma reactions may also be employed in the petrochemical industry as a new method of processing hydrocarbons.

The inventive method and apparatus for reacting dense-phase chemicals in an induced plasma state exhibit many advantages over existing methods and apparatus for conducting plasma reactions. One important advantage lies in the broader applicability of reactants. The inventive method and apparatus can be used for the chemical modification of any liquid, liquid and solid colloidal suspension, or solid material. Unlike prior art methods and devices, the inventive method and apparatus are not limited to gas-phase plasma reactions. In addition, plasma reactions conducted in association with the inventive method and apparatus occur under atmospheric pressure. The lack of requirement for vacuum conditions results in facilitating widespread use of the method and apparatus as well as the ability to obtain consistent results when using the method and apparatus.

Other advantages of the method and apparatus for reacting dense-phase chemicals in an induced plasma state include the production of larger quantities of reaction products, the capability of large scale application of the method and apparatus, and the limited thermal degradation of reaction products which occurs as a result of utilizing the method and apparatus at low temperatures. Further, the problems with static charges and dispersion when reacting solid materials has been overcome with the inventive method and apparatus. Finally, the inventive method and apparatus are efficient and economical as a result of their simplistic operation and low cost.

The objects and advantages of the invention will appear more fully from the following more detailed description of the preferred embodiment of the invention made in conjunction with the accompanying drawings.

DETAILED DESCRIPTION OF THE PRESENT INVENTION

Figure 1:
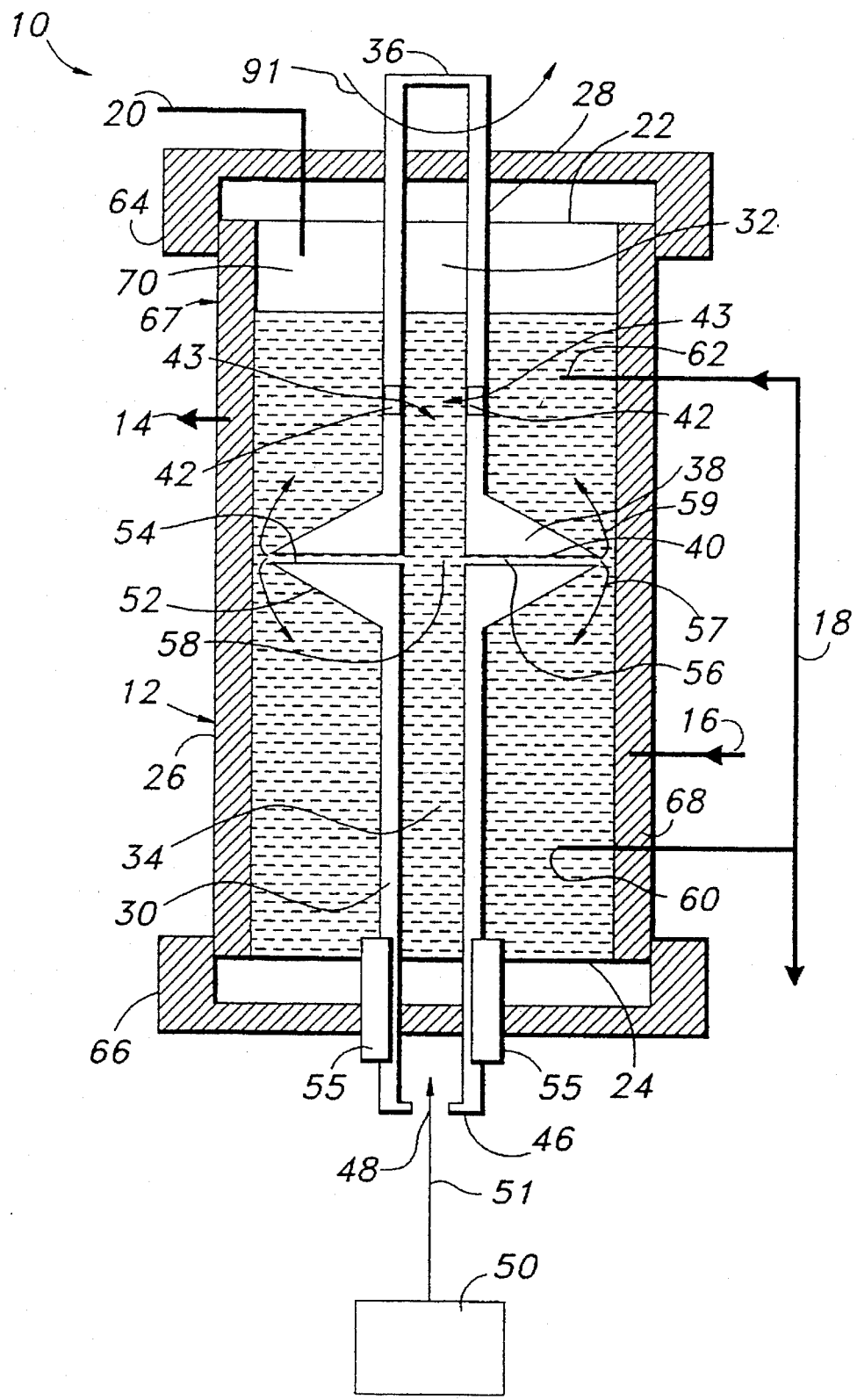
FIG. 1 is a front cross-sectional view of the reaction vessel of the apparatus of the present invention for reacting dense-phase chemicals in an induced plasma state.
Figure 2:
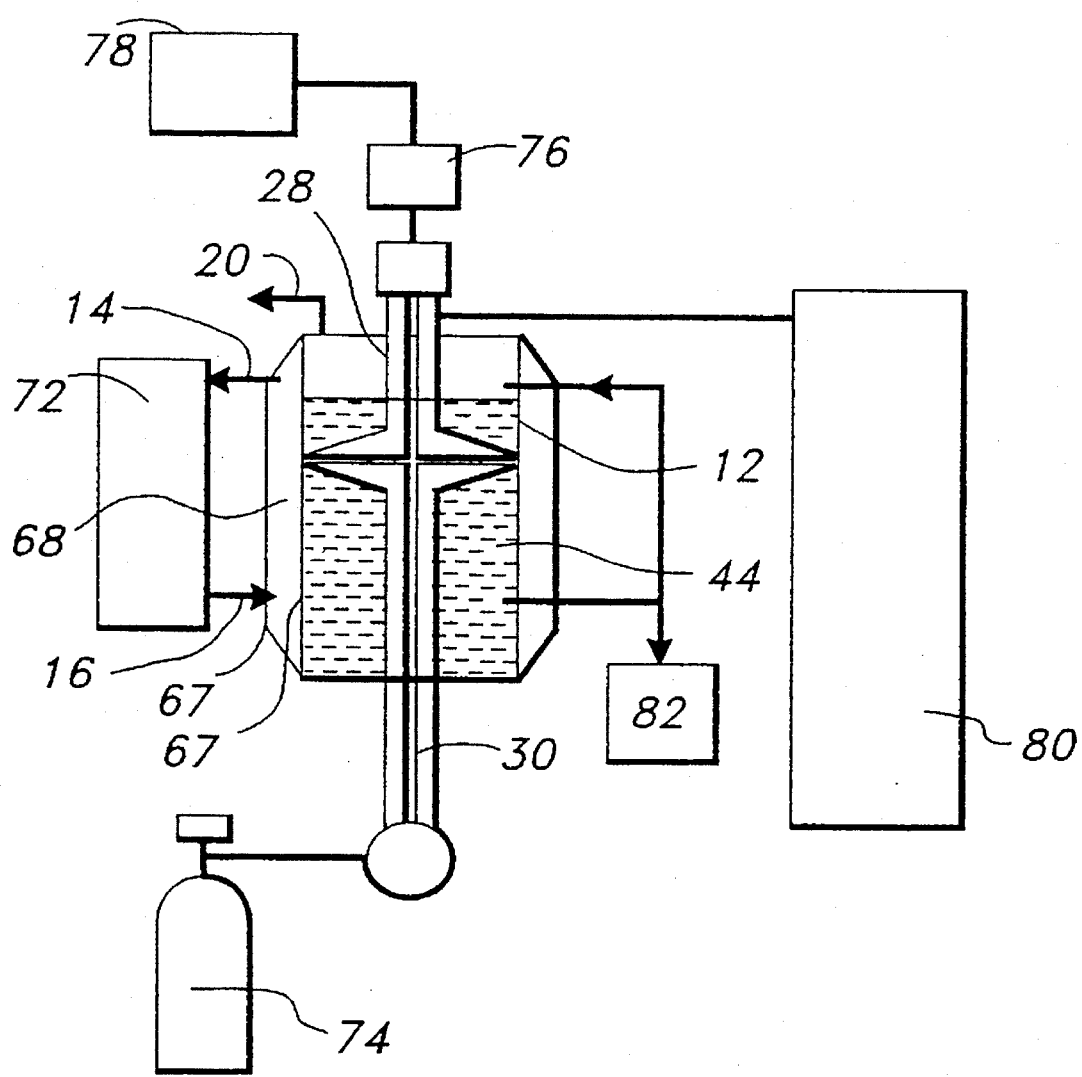
FIG. 2 is a diagrammatic view of the apparatus of the present invention for reacting dense-phase chemicals in an induced plasma state.

The present invention provides a method and apparatus for reacting dense-phase chemicals in an induced plasma state. Referring now to the figures, where the reference numerals represent various elements and steps of the present invention, the medium density plasma reactor 10 is generally illustrated in FIGS. 1 and 2.

The medium density plasma reactor 10 comprises a reaction vessel 12, first and second thermostats 14, 16, a reactant recirculation line 18, a gas vent 20, and a means for cooling the reaction vessel (not shown). The reaction vessel 12 comprises a first top end 22, a second bottom end 24, and side ends 26 which may take the form of a cylindrical wall or a plurality of planar members which fit together with the top end 22 and bottom end 24 to define an enclosed area. The reaction vessel 12 also includes an upper rotatable electrode 28 and a lower static electrode 30 which contain an upper hollow shaft 32 and a lower hollow shaft 34, respectively. The hollow shafts 32, 34 of the upper rotatable electrode 28 and the lower static electrode 30 are located end to end in vertical orientation with one another within the reaction vessel 12.

The upper rotatable electrode 28 contains a first end 36 which is attached to a means for rotating the upper rotatable electrode (not shown), a second disk-shaped end 38 which culminates in an upper planar electrode face 40, and a plurality of ports 42 located circumferentially about the upper rotatable electrode 28 such that the upper hollow shaft 32 is opened to a reactant material 44 contained within the reaction vessel 12. The plurality of ports 42 preferably comprise three holes which are symmetrically positioned (120 degrees) about the circumference of the upper rotatable electrode 28 and located at the middle range of the upper rotatable electrode 28.

The lower static electrode 30 contains a lower end 46 having a lower port 48, which is connected to an inert gas supply 50, and an upper disk-shaped end 52 which culminates in a lower planar electrode face 54. The lower static electrode 30 also comprises a vertical movement system 55 for translating the lower static electrode 30 in a vertical direction.

The upper planar electrode face 40 and the lower planar electrode face 54 are located parallel to one another and oppose each other such that a small planar gap 56 exists between them. The vertical movement system 55 of the lower static electrode 30 is used to adjust the distance between the upper planar electrode face 40 and the lower planar electrode face 54. Furthermore, the upper planar electrode face 40 and the lower planar electrode face 54 each contain a central opening 58 to allow the interior of the upper hollow shaft 32 and the interior of the lower hollow shaft 34 to communicate with the planar gap 56 between the upper planar electrode face 40 and the lower planar electrode face 54.

The surface area of the upper planar electrode face 40 and the lower planar electrode face 54 is slightly smaller than the cross-sectional area of the reaction vessel 12 thereby allowing reactant material 44 to escape in the direction of arrows 57 and 59 into other areas of the reaction vessel 12 outside of the planar gap 56 when the upper rotatable electrode 28 is rotated. The upper rotatable electrode 28 and the lower static electrode 30 may be comprised of various materials including stainless steel, copper, graphite, silver, platinum, and nickel. The composition of the electrodes 28, 30 will, in some cases, determine the composition of the reaction products which are produced when utilizing the medium density plasma reactor 10. For example, nano-particle type metal implantations were evidenced when employing a dense medium plasma reactor 10 which contained copper and stainless steel electrodes.

As previously indicated, the reaction vessel 12 also has several appendages which, together with the reaction vessel 12, comprise the medium density plasma reactor 10. A reactant recirculation line 18 is connected to the reaction vessel 12 to enable reactant material 44 to be transported from a lower site 60 within the reaction vessel 12 to an upper site 62 within the reaction vessel 12. The reactant recirculation line 18 is preferably contained within a cooling chamber (not shown) to assist in cooling the reactant material 44. Alternatively, the reactant recirculation line 18 may comprise a double-walled system in which a cooling agent such as liquid nitrogen may be circulated about the surface area of the reactant recirculation line 18 in order to cool the reactant material 44 contained within the reactant recirculation line 18. The reactant recirculation line 18 enhances the efficiency of inducing the plasma state of dense-phase chemicals to produce reaction products by facilitating the cooling of the reactant material 44 and aiding in the mixing of the reactant material 44.

The reaction vessel 12 is supported and held by an upper holder 64 and a lower holder 66, each of which have openings to allow for the upper rotatable electrode 28 and the lower static electrode 30 to pass therethrough, respectively. The reaction vessel 12 is preferably comprised of glass and double-walled 67 to assure that the system is maintained at a designated temperature by recirculating cooling agents through a mantle area 68 located between the double walls 67 of the reaction vessel 12. First and second thermostat connections 14, 16 are preferably located at opposite sides and ends of the reaction vessel 12 to monitor and control the temperature of the reaction vessel 12. The thermostat 72 may include automated temperature control circuitry.

In operation, a positive supply of inert gas, such as argon, is introduced via line 51 from gas supply 50 into the reaction vessel 12 through a small central opening 48 in the lower hollow shaft 34 of the lower static electrode 30. The inert gas in the reaction vessel 12 forms a gas blanket over the reactant material 44 in the gas trap 70 which is located above the reactant material 44. The gas blanket formed in the gas trap 70 provides a safety feature which is especially important when reacting combustible reactant materials such as benzene. The gas vent 20 is located at the top of the reaction vessel 12 to vent the gas blanket to the atmosphere and thereby maintain the system at atmospheric pressure. The positive supply of inert gas 50 through the lower hollow shaft 34 of the lower static electrode 30 ensures that the inert gas blanket located above the reactant material 44 is maintained. Reactive gases, such as chlorine gas, may also be introduced into the reaction vessel 12 for synthesis purposes. The lower port 48 at the lower end 46 of the lower static electrode 30 permits the inert or reactive gas to be fed into the reaction vessel 12 before and/or during the plasma processes for both degassing and synthesis purposes.

During use, the reaction vessel 12 is filled with reactant material 44 such that the reactant material 44 covers the plurality of ports 42 in the upper rotatable electrode 28. The temperature of the reaction vessel 12 is controlled by means of the thermostat 72 which controls the temperature of a cooling agent, such as cooled alcohol or liquid nitrogen, which is circulated in the mantle 68 between the double walls 67 of the reaction vessel 12. An inert or reactive gas, which originates from a gas supply means 74, is introduced through the lower static electrode 30, passed through the reactant material 44, and vented through the gas vent 20.

The upper rotatable electrode 28 is rotated by means of a motor 76, preferably an electric motor, which is controlled by a motor speed controller 78, known to the art. Electric power is transferred to the electrodes with the aid of a DC-power supply. A peristaltic pump 80 is used to recirculate the reactant material 44. At the end of the reaction, the final reaction mixture is eliminated under gas blanket conditions and collected in a collection vessel 82, which is preferably made of glass.

Figure 3:
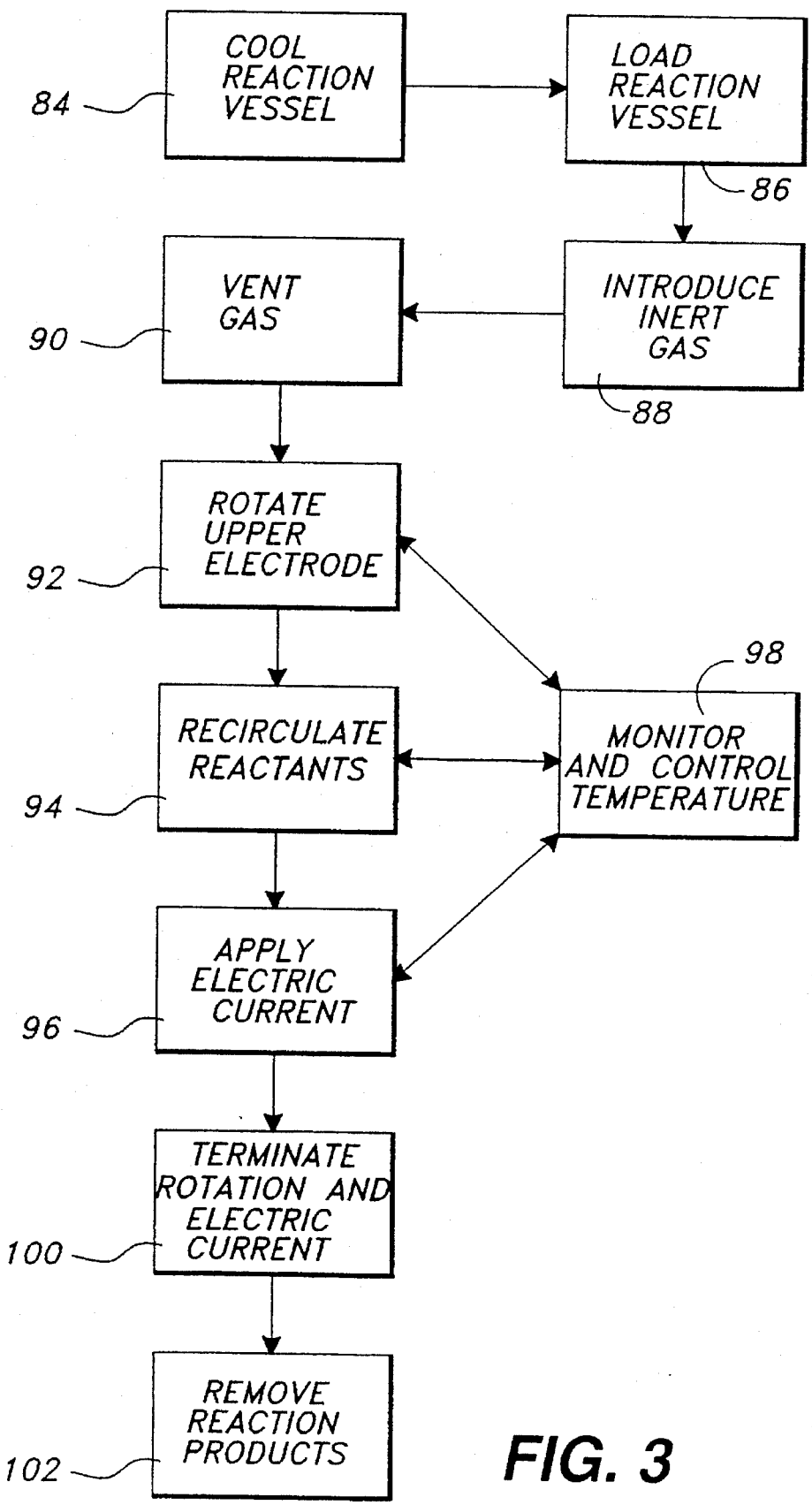
FIG. 3 is a flowchart showing the steps of the method of the present invention for reacting dense-phase chemicals in an induced plasma state.

The inventive method for reacting dense-phase chemicals in an induced plasma state will now be described with reference to FIGS. 1 through 3. FIG. 3 is a flowchart which shows the steps involved in carrying out the method of the present invention for reacting dense-phase chemicals in an induced plasma state.

First, the reaction vessel 12 of the medium density plasma reactor 10 is cooled at step 84 by recirculating cooling agents such as gas or liquid nitrogen, or cooled alcohol, through the mantle area 68 located between the walls 67 of the double-walled reaction vessel 12. Next, the reaction vessel 12 is loaded at step 86 with a dense-medium reactant material 44. Upon loading the reaction vessel 12 at step 86, a positive supply of inert gas 50 is introduced at step 88 into the reaction vessel 12 through the lower port 48 contained in the lower static electrode 30. As previously described, the inert gas travels through the lower hollow shaft 34 of the lower static electrode 30, through the small central opening 58 located at the upper end 52 of the lower static electrode 30, through the reactant material 44, and up to the gas trap 70 in the reaction vessel 12 located above the reactant material 44. The inert gas then forms a gas blanket over the reactant material 44. The gas blanket is vented at step 90 to the atmosphere to accommodate the positive supply of inert gas that is being introduced at step 88 through the lower static electrode 30, thereby maintaining the system at atmospheric pressure. Higher pressure conditions combined with low temperatures can also be used for more volatile reactants such as silicon tetrachloride and isobuthylene.

Once the system has achieved low temperature and atmospheric pressure conditions, the upper rotatable electrode 28 is rotated in the direction of arrow 91 at step 92 at a high speed somewhere in the range of 500 to 5,000 revolutions per minute, which results in the recirculation at step 94 of the reactant material 44. A direct electric current is then applied at step 96 to the upper planar electrode face 40 of the upper rotatable electrode 28 and the lower planar electrode face 54 of the lower static electrode 30.

The reactant material 44 must be circulated between the upper and lower planar electrode faces 40, 54 because the plasma reaction only occurs in the planar gap 56 located between the electrode faces 40, 54. The recirculation at step 94 of the reactant material 44 results from the centrifugal force created by the rotation at step 92 of the upper planar electrode face 40 relative to the lower planar electrode face 54. This centrifugal force causes the reactant material 44 located between the electrode faces 40, 54 to move radially outward in the direction of arrows 57, 59. The radial outward movement of the reactant material 44 creates a vacuum effect which draws more reactant material 44 from within the reaction vessel 12 in the direction of arrows 43 through the plurality of ports 42 located in the upper rotatable electrode 28, into the upper hollow shaft 32 of the upper rotatable electrode 28, and down through the central opening 58 of the upper rotatable electrode 28 to the planar gap 56 located between the electrode faces 40, 54.

The rotation at step 92 of the upper rotatable electrode 28 also aids in recirculating the reactant material 44 at step 94 between lower and upper sites 60, 62 contained within the reaction vessel 12. The same centrifugal force created by rotating the upper planar electrode face 40 in relation to the lower planar electrode face 54 at step 92 causes some of the reactant material 44 located in the planar gap 56 between the electrode faces 40, 54 to gravitate into the lower portion of the reaction vessel 12. This gravitation of reactant material 44 subsequently forces reactant material 44 to recirculate from a lower site 60 within the reaction vessel 12 to an upper site 62 within the reaction vessel 12 at step 94 via the reactant recirculation line 18 and peristaltic pump 80 which comprises part of the medium density plasma reactor 10. In summary, the centrifugal force created by rotating the upper rotatable electrode 28 induces a very intense movement and mixing of the reactant material 44.

The rotation at step 92 of the upper rotatable electrode 28 permits the fast removal of active species from the plasma zone, i.e., that area which constitutes the planar gap 56 located between the electrode faces 40, 54, thereby inhibiting the development of extensive decomposition reactions. In addition, the rotation of the upper rotatable electrode 28 at step 92 aids in the achievement of a caloric energy equilibrium of the reactant material 44.

A small amount of direct electric current is applied at step 96 to the electrode faces 40, 54 when carrying out the inventive method for reacting dense-medium chemicals in an induced plasma state. Preferably, the direct current applied across the electrode faces 40, 54 is in the range of 100 to 800 Volts. The voltage applied to the electrodes at the starting point (800 V) decreases to 30–40 Volts during the reaction, which is determined by the conductivity of newly synthesized compounds, and the DC current stabilizes between the limits of 3–4 Amps. This results in a power range of 90–160 Watts. By applying a low energy direct electric current to the electrode faces 40, 54 at step 96 and rapidly rotating the upper planar electrode face 40 relative to the lower planar electrode face 54 at step 92, the electric discharge or discharges are initiated in different locations of the plasma zone, i.e. different locations within the planar gap 56, thereby eluding the creation of local caloric energy concentrations. As a result, the reaction mechanisms produced from the inventive method and apparatus for reacting dense-phase chemicals are controlled by electron flux intensity rather than thermal energy.

The temperature of the system and, therefore, the temperature of the material contained within the reaction vessel 12 is monitored and controlled at step 98 by a thermostat having first and second thermostat connections 14, 16 which are placed on opposite sides and ends of the reaction vessel 12. As previously stated, the thermostat may include automated temperature control circuitry to facilitate the monitoring and control of the temperature of the reactant material 44 and the reaction vessel 12. The reaction vessel 12 houses both reactant materials 44 and reaction products. Upon completion of the reaction mechanisms carried out in association with the inventive method and process for reacting dense-phase chemicals, the application of the direct electric current at step 96 and the rotation of the upper rotatable electrode 28 at step 92 are terminated at step 100 and the resulting reaction products are removed at step 102 from the reaction vessel 12.

The method for reacting dense-phase chemicals in an induced plasma state may also be carried out as a continuous flow-system reaction. This can be achieved by selecting the proper residence times of dense media in the reactor and employing a peristaltic pump to feed the dense medium in and out of the reaction vessel via input and output lines which are connected to the reaction vessel.

Various dense-medium chemicals were utilized as reactant materials when employing the inventive method and apparatus for reacting dense-phase chemicals in an induced plasma state. As a result, unique reaction products were obtained as evidenced by the following examples:

The following examples are offered by way of illustration and not by way of limitation.

EXAMPLE 1

(Benzene Plasma Reaction)

Materials and Methods

A volume of liquid benzene (250 milliliters (ml)) was loaded into the reaction vessel of the medium density plasma reactor, and the inventive method for reacting dense-phase chemicals utilizing the medium density plasma reactor was carried out as described above.

The system was first cooled and manipulated in order to achieve a low temperature and atmospheric pressure conditions. Alcohol cooled to 10° C. was used as the cooling agent. Argon gas was introduced and vented to maintain atmospheric pressure. The distance between the upper rotatable electrode and the lower static electrode was set at 0.5 millimeters (mm). The upper electrode was then rotated at approximately 5,000 revolutions per minute (RPM) and a direct electric current of 30–40 volts was applied to the planar face of the upper electrode. The resulting current was between 3–4 amps and the reaction was carried out at different times over the range of 10 to 30 minutes. Three different types of electrodes were used to carry out the above detailed process: electrodes comprised of stainless steel, electrodes comprised of copper, and electrodes comprised of graphite.

Figure 4:
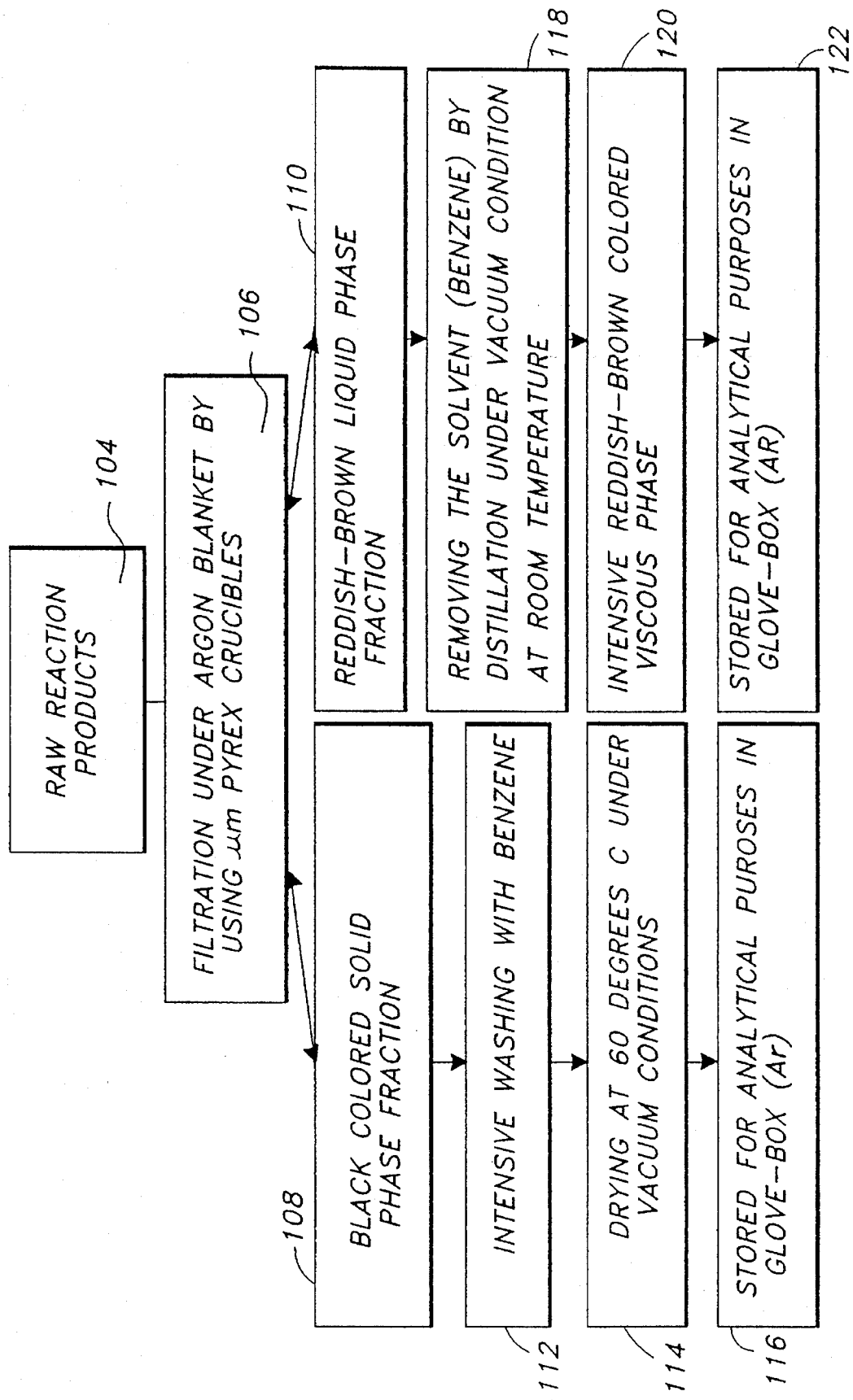
FIG. 4 is a flowchart showing the steps of purifying and isolating the raw reaction products from the method of the present invention for reacting dense-phase chemicals in an induced plasma state using benzene as the dense-medium reactant material.

Two reaction products were obtained. FIG. 4 illustrates a flowchart showing the purification and isolation steps of the raw reaction products. The raw reaction products 104 were filtered under argon blanket conditions using micrometer crucibles at step 106. The filtration at step 106 resulted in two reaction products, a black colored solid phase fraction 108 and a reddish-brown liquid phase fraction 110. The black colored solid phase fraction 108 underwent intensive washing with benzene at step 112. The washed solid fraction was then dried at 60° C. under vacuum conditions at step 114. Finally, the washed and dried solid fraction was stored in a controlled atmosphere glove box at step 116 for analytical purposes.

Next, the solvent (benzene) is removed from the reddish-brown liquid phase fraction 110 by distillation under vacuum conditions at room temperature in step 118. The removal of the solvent in step 118 results in an intensive reddish-brown colored viscous phase fraction 120. Like the solid fraction, the reddish-brown colored viscous phase fraction is then stored in a controlled atmosphere glove box at step 122 for analytical purposes.

*Analysis of Reaction Products*

The FT-IR spectra of solid phase and benzene soluble fractions were recorded on a Perkin Elmer FT-IR×1600; 10 scan; 4 cm$^{-1}$; instrument (pellets produced by mixing the solid phase samples with KBr and pressed under vacuum condition at 10,000 atmospheres (arm); and films deposited on KBr pellets, from benzene solutions).

Thermal properties of samples were estimated by using Differential Thermal Analysis (DTA) on a TG-DTA SEICO apparatus (-temperature program range: 19°–600° C.; -heating range: 5° C./min; -inert gas: Argon) and Differential Scanning Calorimetry (DSC) on SEICO 220 instrument (-temperature program range - 125°–500° C.; heating rate: 10° C./min; -inert gas: Argon).

Analyses of surface atomic ratios of insoluble powdery samples were carried out using X-ray photoelectron spectroscopy (ESCA-Perkin Elmer Physical Electronics 54000 Small area Systems; Mg source; 15 kV; 300 W). Atomic percentages for carbon ($C_{1S}$), iron and copper were monitored.

The solid phase and benzene soluble samples were investigated by using GC-MS (GC-Carlo-Erba Fractovap 4162; MS-Kratos MS-25) and high resolution MS (Kratos MS-80) techniques. The following experimental conditions were adapted for GC-MS measurements: column-fused silica, length-30 m, ID-0.32 mm, coating-0.25 micrometer of 5% phenyl and 95% methyl polysiloxane, injector temperature- 5° C., column temperature profile: 20° C./minute heating rate in the interval of 30°–280° C., electron beam energy: 26 eV./ The high resolution MS data were recorded by depositing the powdery samples directly on the heating edge of the solid probe introducing device, and heating up instantly to about 400° C. The Wiley Registry Mass Data Base was used to assign some of the structures to the experimental spectra.

Comparative ESR (electron spin resonance) spectra of insoluble reaction products and DPPH (diphenyl pycryl hydrazyl) were recorded by using a Bruker Analytische Messtechnic X-band ESR spectrometer (Operating conditions: -center field:b 332955 1 G; -sweek with: 0700.00 G and 150.00 G; -resolution: 2048 points; -frequency: 9.3350230 GHz and (0.3458530 GHz; power: 8.0 mW). The samples for measurements were uniformly packed, with the aid of a mechanical vibrator, into quartz capillary tubings (Suprasil Quartz EPR Sample Tubes-Wilmad Glass, length- 250 mm, ED-4 mm, ID-2.4 mm).

Elemental compositions of the insoluble fractions were estimated by ONEIDA Research Services. Nuclear Magnetic Resonance (NMR) investigations were performed on the benzene soluble fractions on a BRUKER 100 MHz instrument (internal standard-1,1,2,2, tetrachloro ethane-d2, 99.96% purity). The morphological aspects of insoluble powdery materials were analyzed by using a JEOL-840 Scanning Electron Microscope (sputtered golden plated samples).

Figure 5:
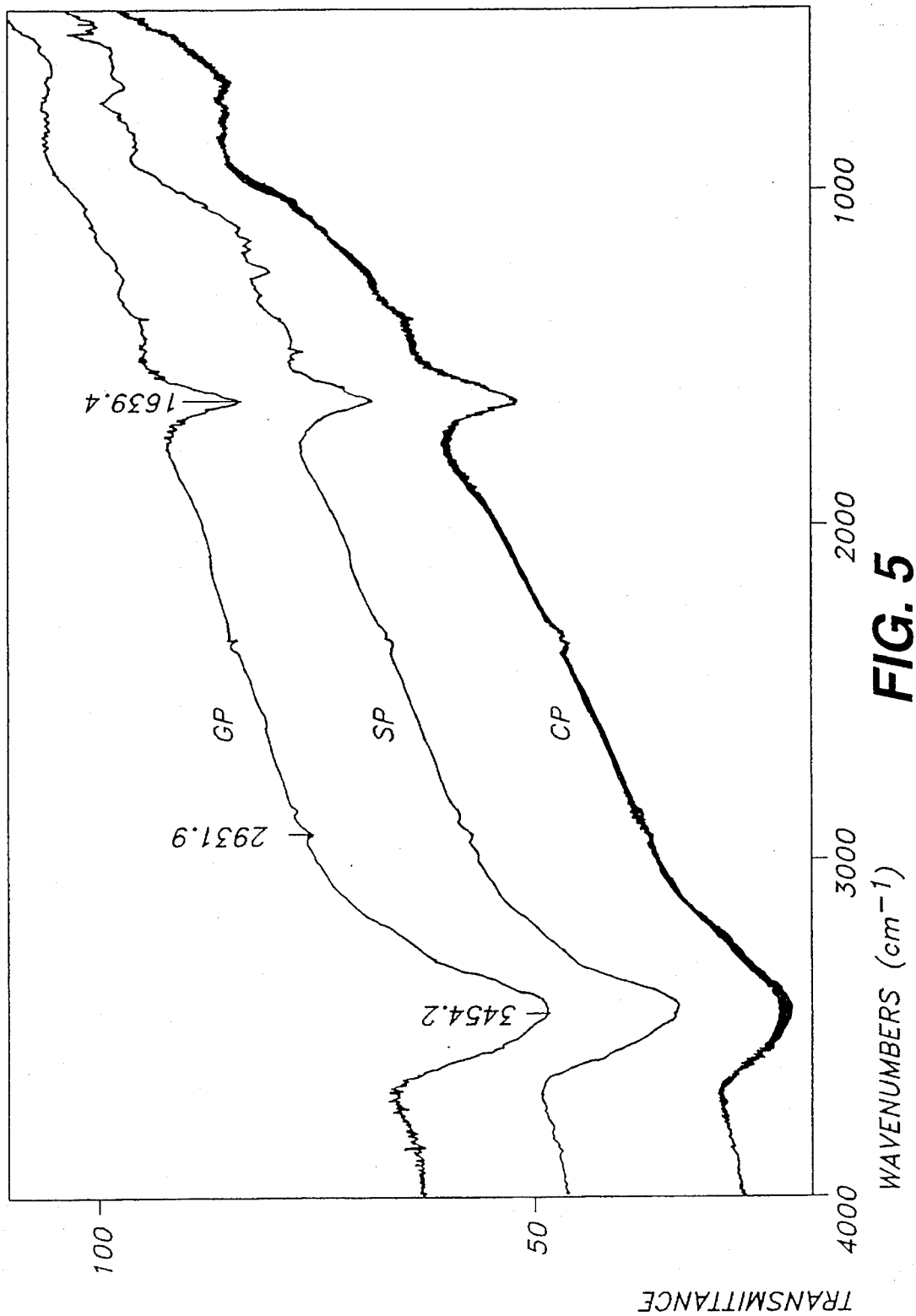
FIG. 5 is a graph showing the infrared (IR) spectra of solid phase black polymers synthesized by using stainless steel (SP), copper (CP), and graphite (GP) electrodes in the dense phase plasma reactor with benzene as the dense phase reactant material.

Preliminary analyses carried out on the black colored insoluble solid phase fraction The comparative IR spectra of solid phase black polymers synthesized by using stainless steel, copper and graphite electrodes are shown in FIG. 5. One can notice almost a total absence of the absorptions in the range of 2850–3000 cm$^{-1}$, peculiar for C-H symmetric and antisymmetric vibrations. Vibrational frequencies characteristic for aromatic groups (3000–3100 cm$^{-1}$ and 690–780 cm$^{-1}$) are not present in the spectra as well. These findings strongly suggest the existence of intense dehydrogenation and aromatic ring opening processes under dense medium plasma conditions. A strong absorption pattern can be noticed at 1639.4 cm$^{-1}$ indicating the presence of a high amount of —C═C bonds. The high resolution IR diagrams from the range of 1500–1700 cm$^{-1}$ emphasize once again the existence of unsaturation in all of the compounds regardless of the nature of the electrodes which have been used. The presence of a relatively intense absorption around 3454 cm$^{-1}$ suggests the post plasma development of moisture absorption processes during sample handling.

Figure 6:
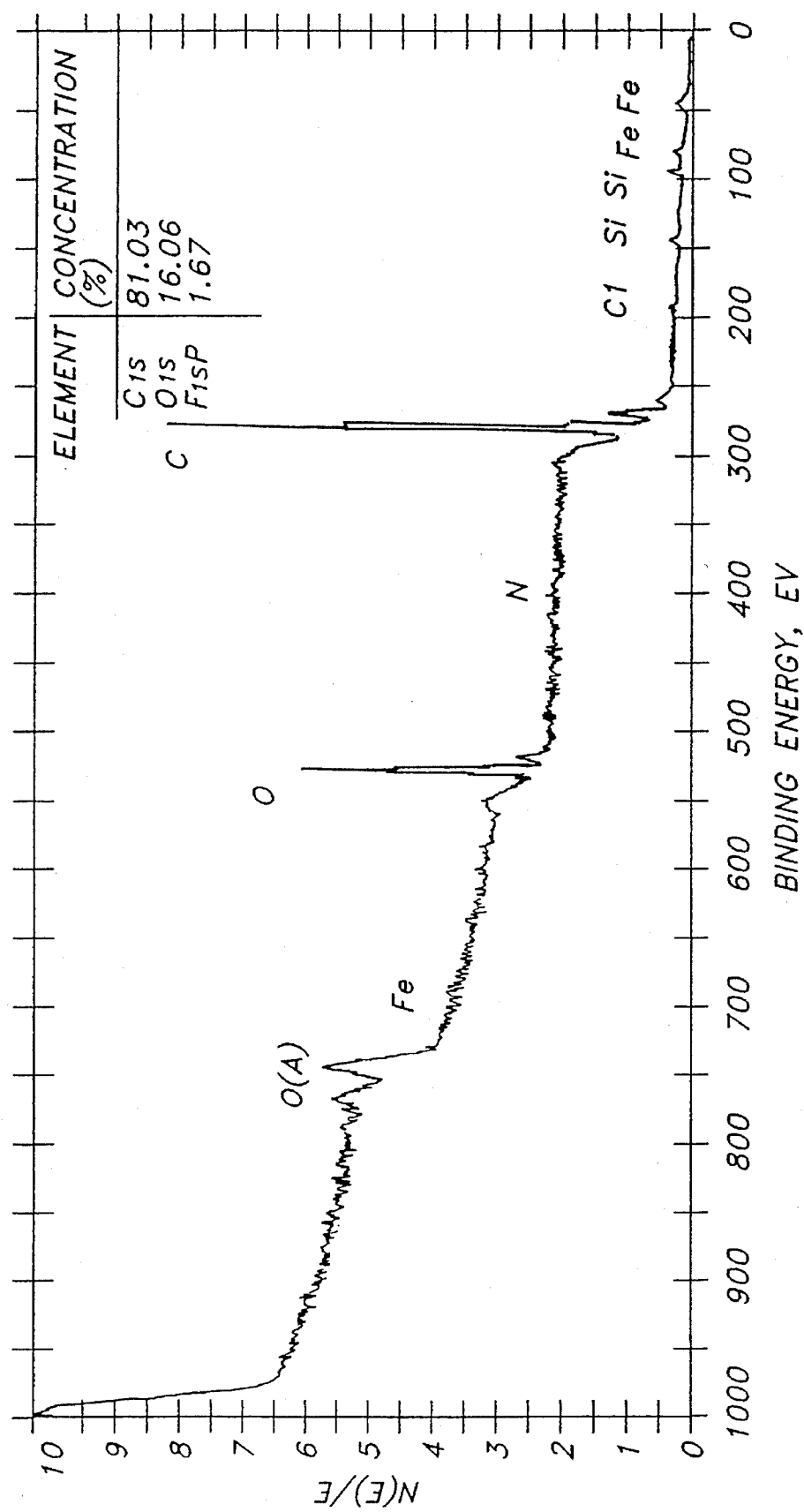
FIG. 6 is a graph showing the X-ray photoelectron spectrum and the corresponding surface atomic ratios for the black polymer synthesized by stainless steel electrodes in the dense phase plasma reactor with benzene as the dense phase reactant material.
Figure 7:
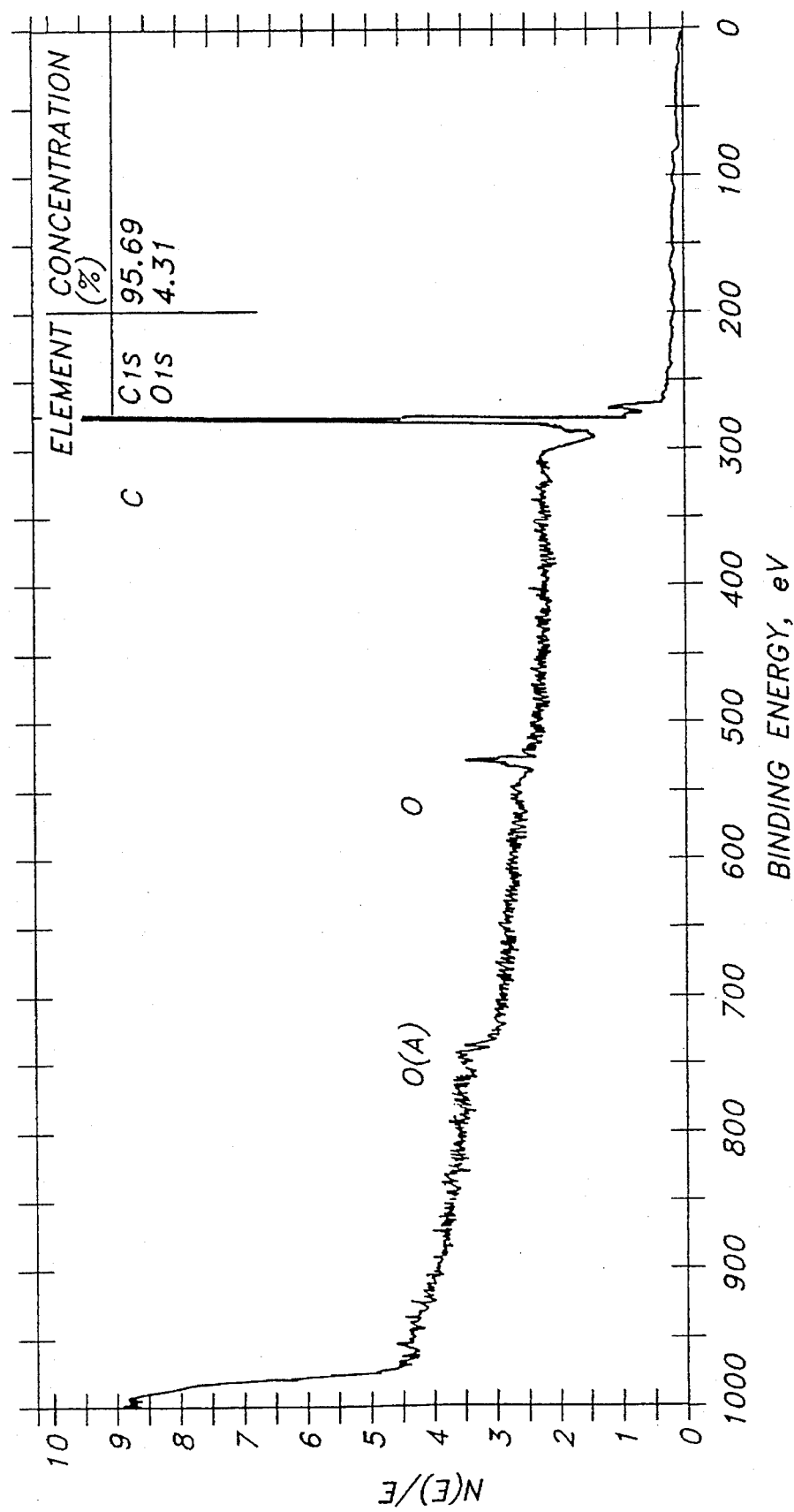
FIG. 7 is a graph showing the X-ray photoelectron spectrum and the corresponding surface atomic ratios for the black polymer synthesized by copper electrodes in the dense phase plasma reactor with benzene as the dense phase reactant material.

ESCA and elemental analysis data are in good agreement with the FT-IR results indicating a high carbon and a low hydrogen content for all of the samples. FIGS. 6 and 7 show typical ESCA survey spectra for the black polymers synthesized by using stainless steel (SP) and copper electrodes (CP) and the corresponding surface atomic ratios. A lower carbon (81%) and a higher oxygen (16%) content can be noticed in the case of SP polymer in comparison to the CP one (C=95.7% and O=4.31%. Metal contamination was noticed only in the case of SP structure (Fe=1.67%). Elemental analysis data indicate a low hydrogen content for both samples.

Figure 8A:
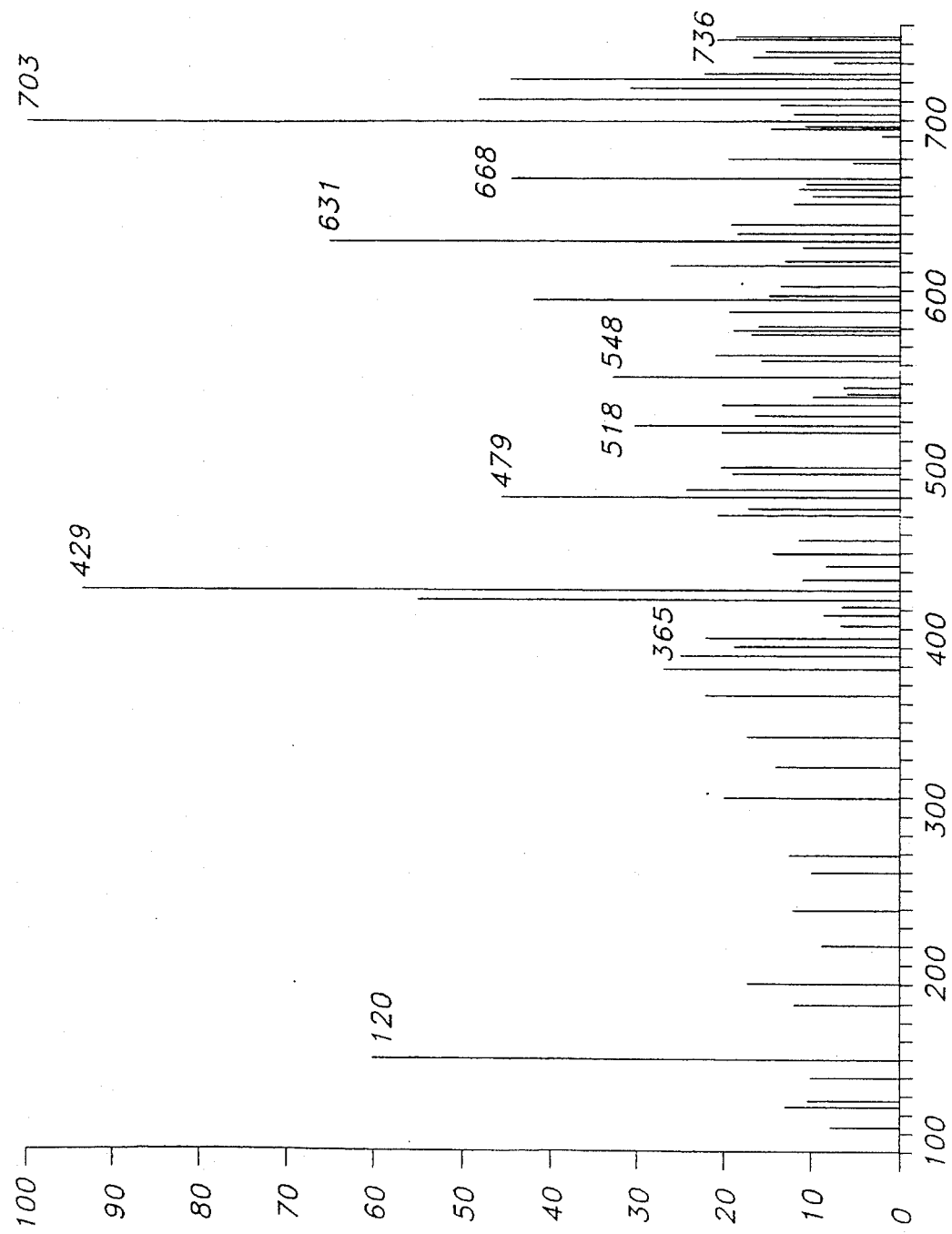
FIG. 8 is a graph showing the high resolution mass spectroscopy spectrum of the volatile fraction of solid polymer synthesized by copper electrodes (CP) in the dense phase plasma reactor with benzene as the dense phase reactant material.
FIG. 8B–8D are tables showing the exact masses of the ionic fragments, their rounded integer values and the corresponding m/z values after possible mass spectroscopy electrons in FIG. 8 induced cleavage of 24, 25, and 26 unit based ionic fragments.

High resolution (HR) MS spectra of the SP, CP and graphite electrode (GP) based polymers carried out at 400° C. shows that even the volatile fractions have relatively high molecular weights (m/z>800) and the electron induced fragmentation results mainly in 26 (—CH=CH—), 25 (—CH=C—) and 24 (—C≡C—) units and their superior omologes. FIG. 8A illustrates a typical HR-MS spectrum of the volatile fraction of CP polymer and FIGS. 8B–8D show a table presenting the exact masses of the ionic fragments, their rounded integer values and the corresponding m/z values after possible MS-electrons induced cleavage of 24, 25, and 26 units based ionic fragments. It is clear that almost all of the experimentally found exact ionic fragments correspond to m/z values derived through the splitting of 24, 25, and 26 based units and their immediate superior omologes. These data indicate that the structure of the black material is polymeric in nature and is comprised of —CH=CH—, —CH=C—, and —C≡C— entities. A plasma induced ring opening mechanism is suggested accompanied by dehydrogenation processes. Obviously, these reactions would lead to stable poly free radical systems with unusual magnetic properties.

The thermal behavior of black polymers has been investigated by using TG/DTA and DSC analyses. All of the samples presented a strong exothermic process in the interval of 150°–600° C.; this phenomenon can be explained by molecular reorganization and decomposition processes. However, the weight loss patterns are significantly different. GP is the most thermally stable structure presenting a weight loss of only 0.8% at 443° C. and 21.3% at 600° C. while SP and CP samples lose 9 and 24% (443° C.) and 28 and 49% (600° C.). The initiation of thermal degradation reactions (initiation of weight loss) differs also in the case of three samples. The highest thermal degradation initiation temperature is noticed in the case of GP polymer (around 400° C.).

The free radical nature of insoluble black polymers were investigated by ESR technique. A symmetrical signal is observed in the case of CP (no coupling was observed). Spectra recorded at low temperatures (−123° K) presented a similar pattern. It is noteworthy that the spectra of SP and GP could not be recorded because of the difficulties in balancing the instrument.

The SP and GP polymers exhibit ferromagnetic properties (the powders of these materials can be translated with a permanent magnet). This behavior can be explained probably by metal contamination or by the existence of stable biradicals in the structure of the polymers. Future high precision magnetization/magnetic susceptibility measurements are required in order to estimate and understand the magnetic properties of these polymers.

Scanning Electron Microscopy (SEM) data bring information of the morphological structure of the polymers. The higher magnification images (×20,000) show the presence of clustered spherical and lamellar type structures.

Preliminary analyses carried out on the benzene-soluble fractions from SP, CP and GP polymers Because of the development of ring opening and dehydration mechanisms under dense medium plasma conditions, the soluble fractions resulting from benzene are composed of complex mixtures of unsaturated hydrocarbon derivatives. Their separation and identification are difficult and require extensive analytical work. However, the analysis of the unseparated soluble fractions by FT-IR and NMR techniques can present valuable information in identifying the predominant functional groups of the molecular mixtures. At the same time, the GC-MS method permits the partial separation and identification of the main constituents. These compounds probably represent intermediate structure in the transformation processes toward high molecular weight unsaturated polyradical structures (polyacetylene/polyene type structures or their partly dehydrogenated correspondents).

FT-IR data show the presence of 2855.6, 2925.9 and 2955.6 cm$^{-1}$ vibrational frequencies, in all cases, which clearly indicates that less intense dehydrogenation processes are associated with the formation of these molecular mixtures. However, the presence of double bonds (1598.8 cm$^{-1}$) can clearly be remarked. Significant differences can be observed at the same time between the IR spectra of LSP, LCP, and LGP derivatives. Fairly intense aromatic character (3052.6 cm$^{-1}$) oxidation (1731 cm$^{-1m}$) and the presence of —C=C— bonds can be noticed in the cases of LSP and LCP, while LGP almost totally lacks these functionalities. FT-IR spectra for LSP and LCP show the existence of C—H aromatic vibrations at 754.4 and 701 cm$^{-1}$. This vibration is almost totally absent in the case of LGP.

NMR measurements of LSP, LCP and LGP carried out in 99.96% purity 1,1,2,2 tetrachloro ethane-d2 is in good agreement with the FT-IR results; the existence of a less intense aromatic absorption (6.5–8.5 ppm) can be shown in the case of LGP. It is noteworthy that all of the samples exhibit an intense triplet in the domain of 0.5–2.0 ppm. These absorptions indicate the presence of —(—CH$_2$)x— CH$_3$ groups. Active hydrogen atoms liberated under the action of plasma energy might be responsible for the development of rehydrogenation processes outside the plasma zone.

Figure 9:
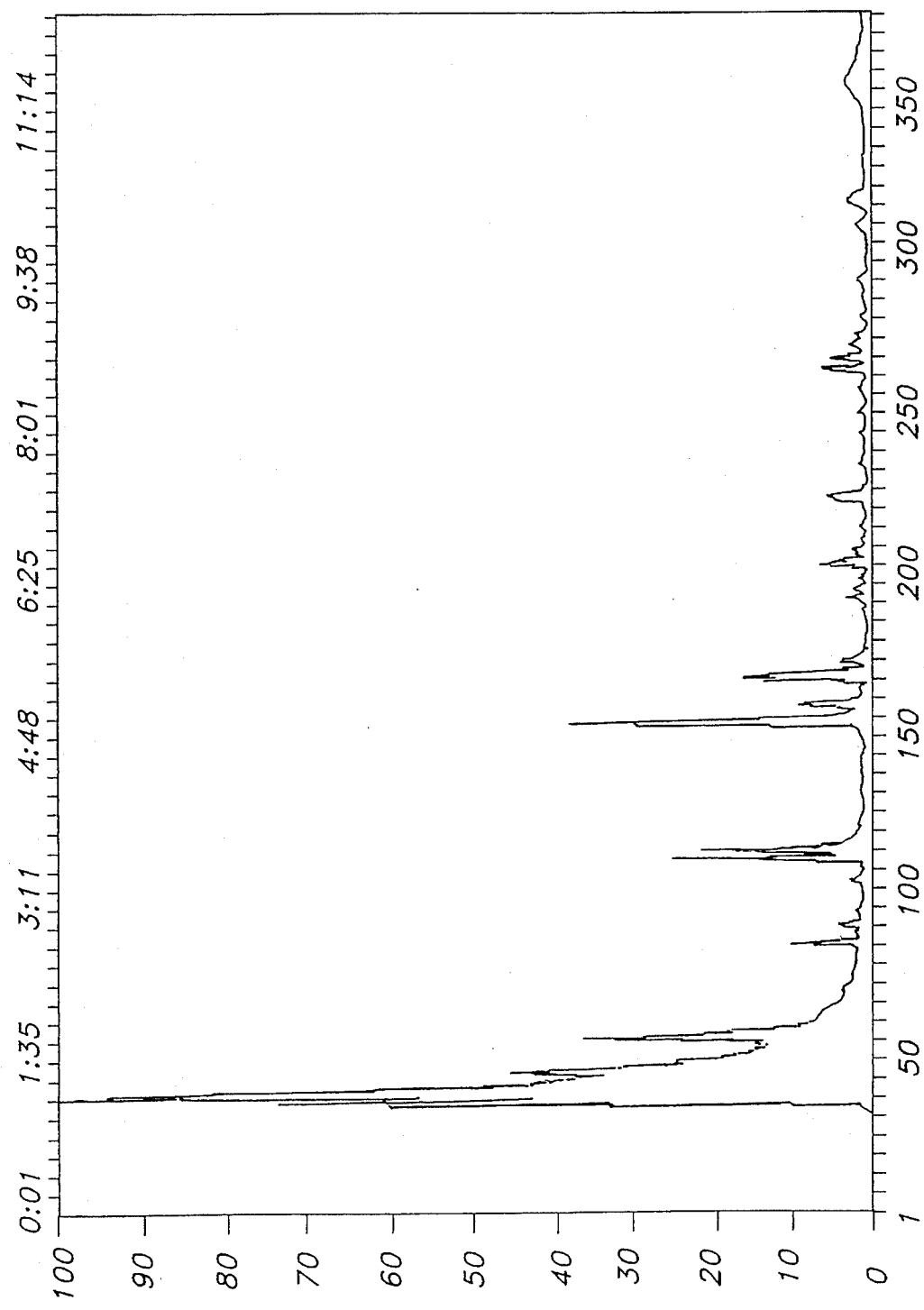
FIGS. 9 and 10 are graphs showing the gas chromatograph diagrams for the liquid polymers synthesized using stainless steel electrodes (LSP) and copper electrodes (LCP), respectively, in the dense phase plasma reactor with benzene as the dense phase reactant material.
Figure 10:
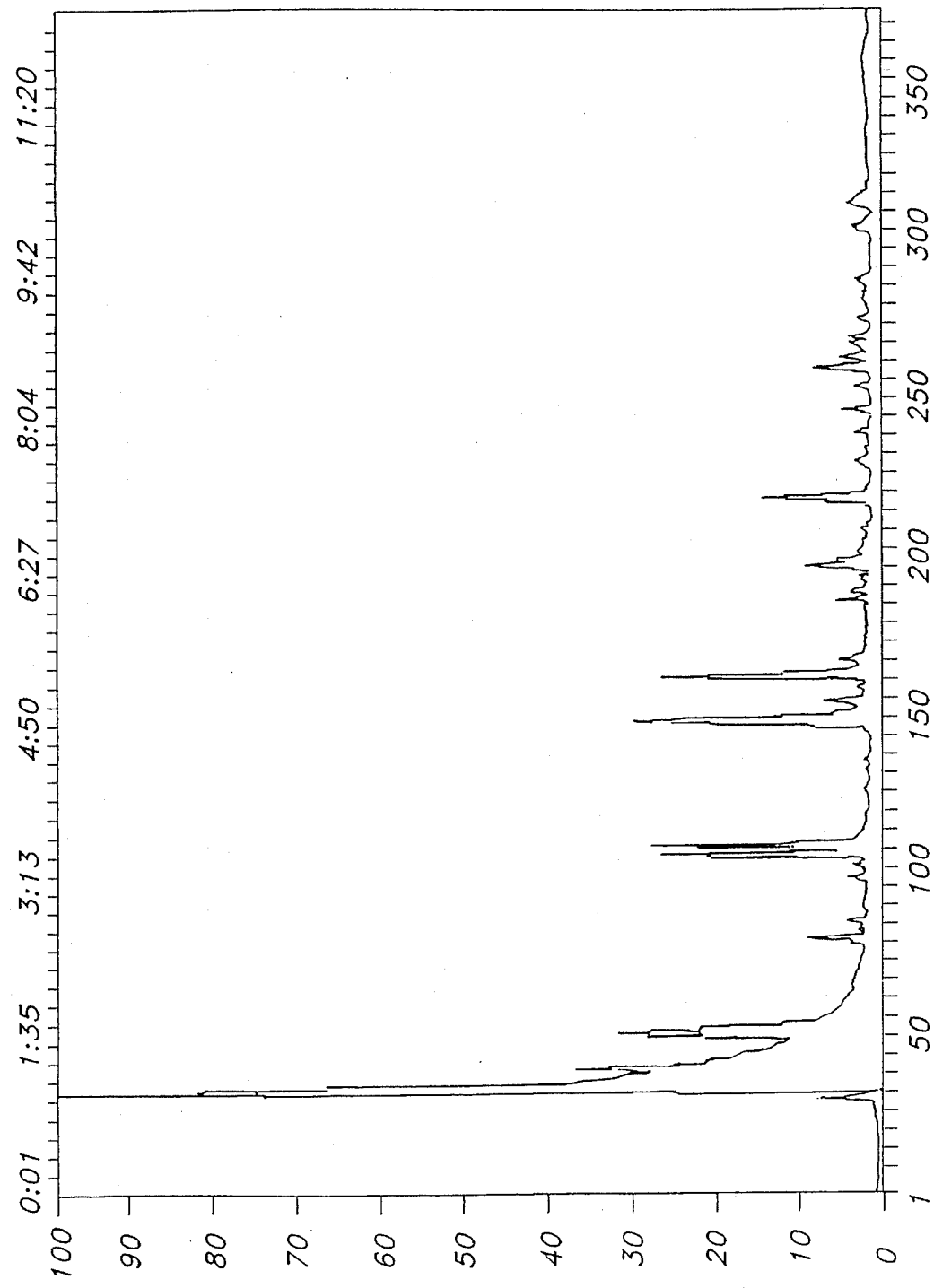
Figure 11:
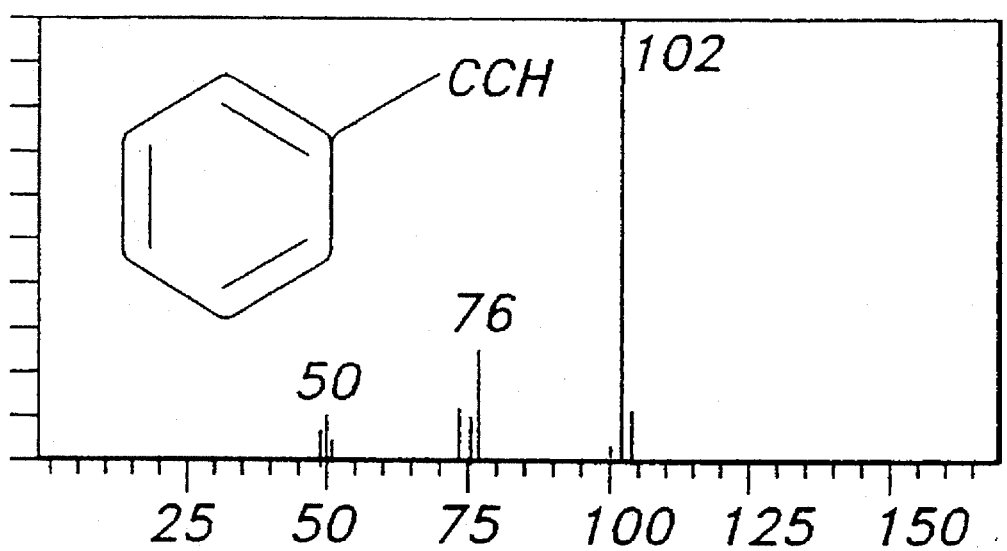
FIGS. 11, 12A–12E, 13A–13G, 14A–14B, and 15A–15B are the possible corresponding chemical structures (isomers included) for gas chromatograph peaks 54, 112, 151, 164, and 198 based on Wiley Reference Spectra.
Figure 12A:
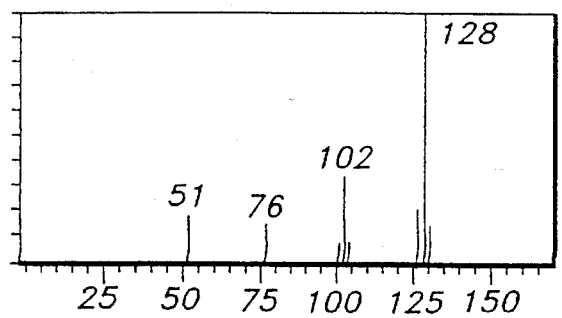
Figure 12B:
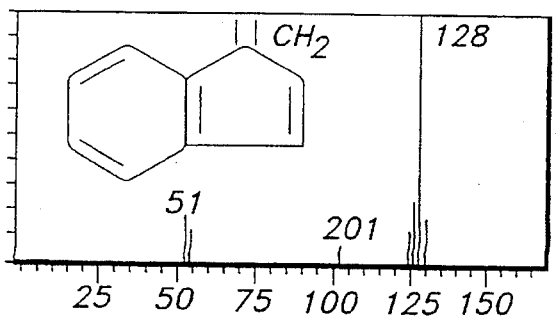
Figure 12C:
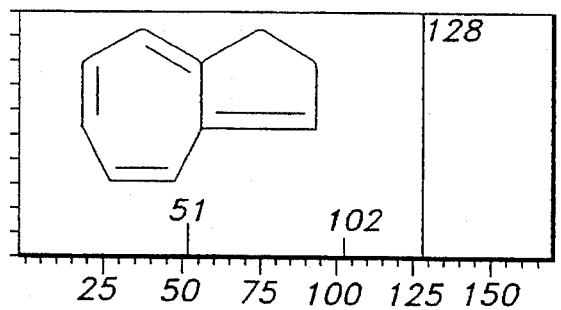
Figure 12D:
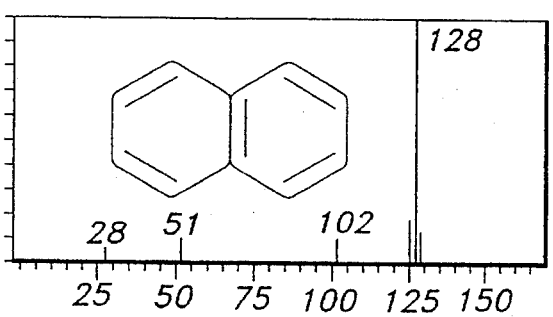
Figure 12E:
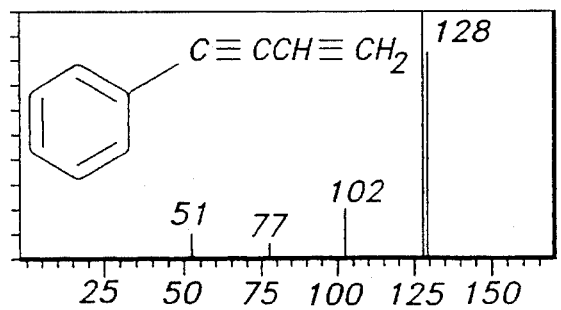
Figure 13A:
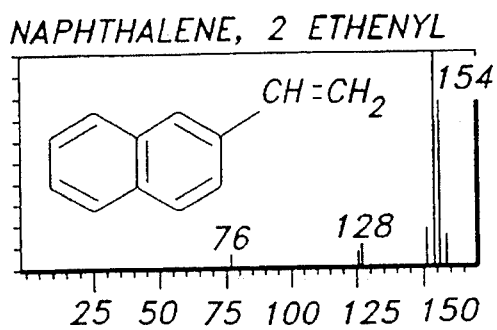
Figure 13B:
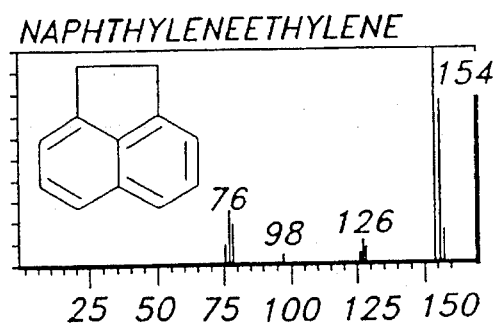
Figure 13C:
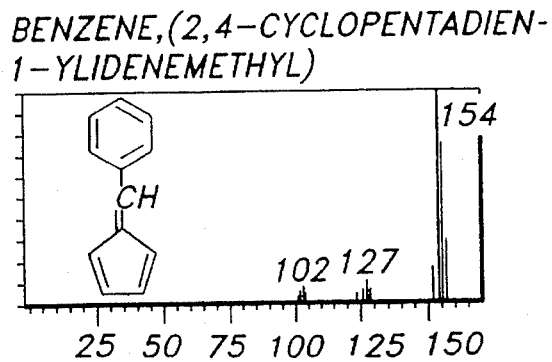
Figure 13D:
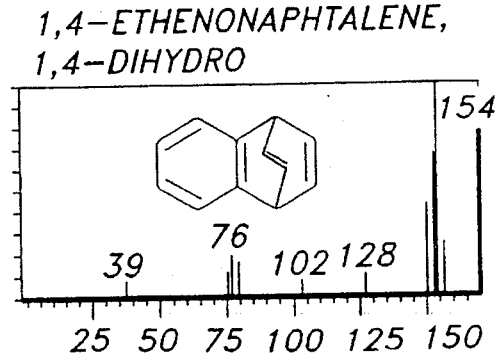
Figure 13E:
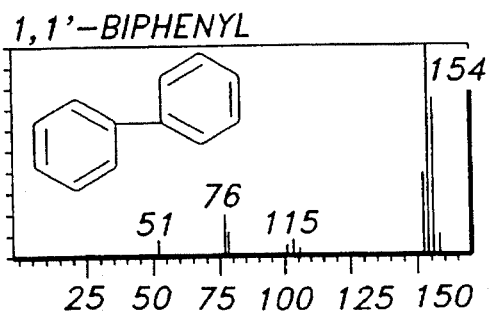
Figure 13F:
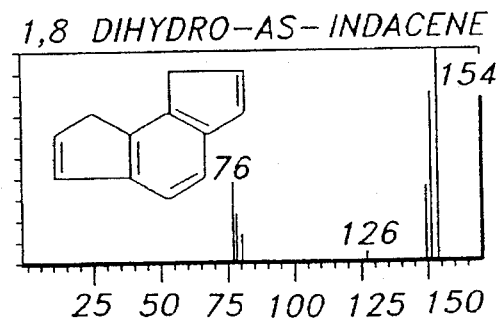
Figure 13G:
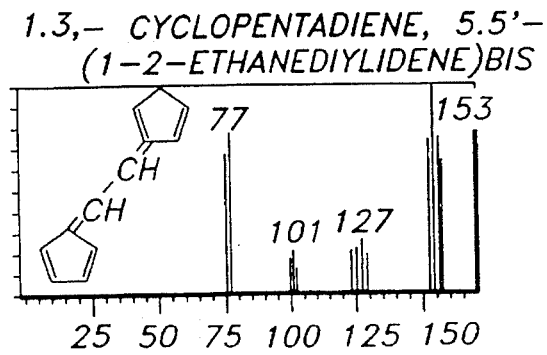
Figure 14A:
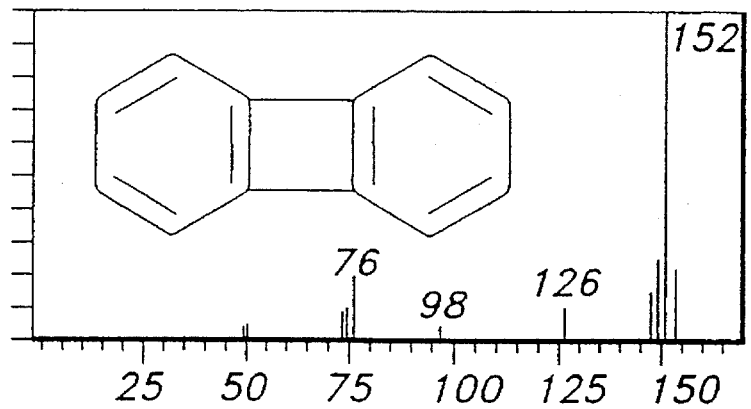
Figure 14B:
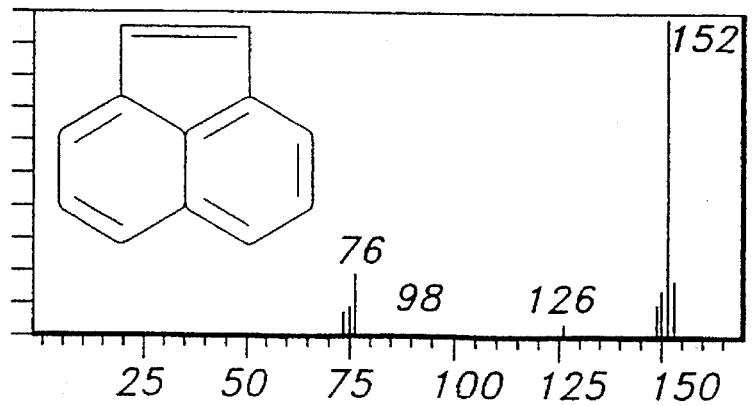
Figure 15A:
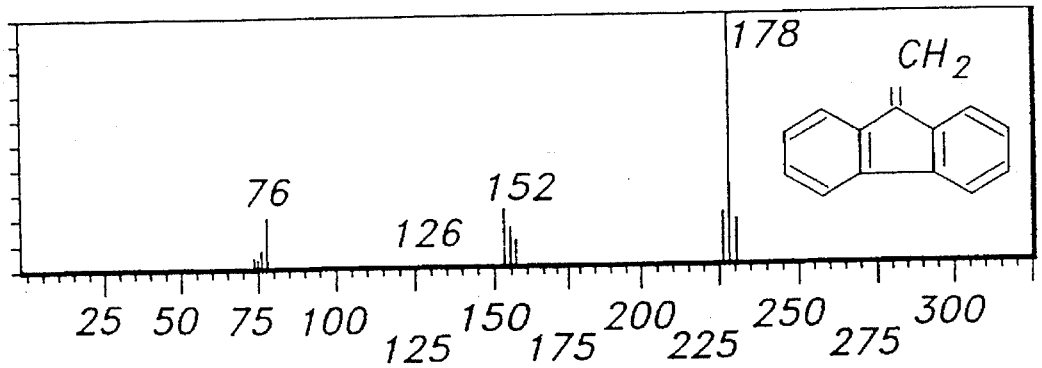
Figure 15B:
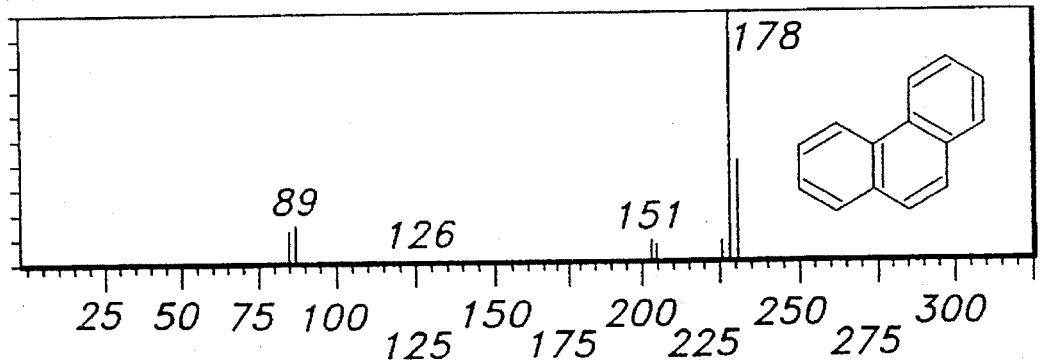
Figure 15C:
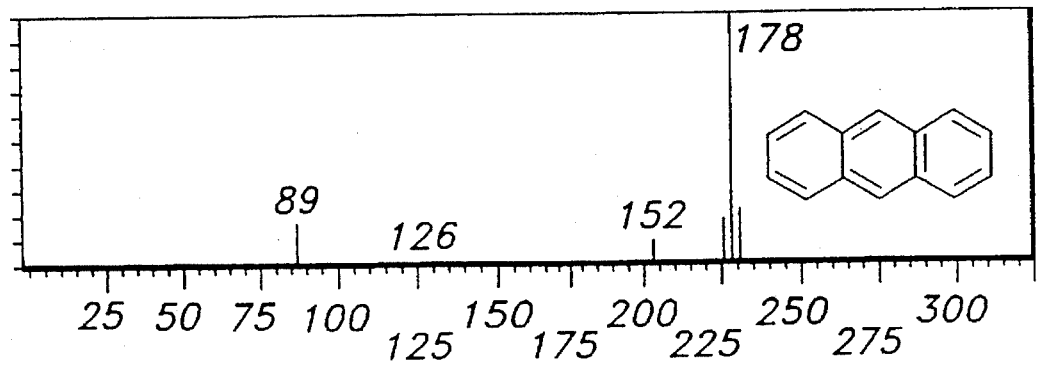
Figure 15D:
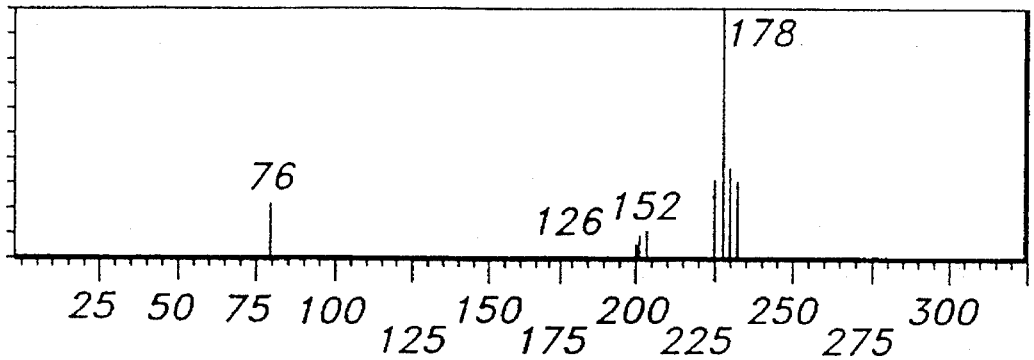
Figure 15E:
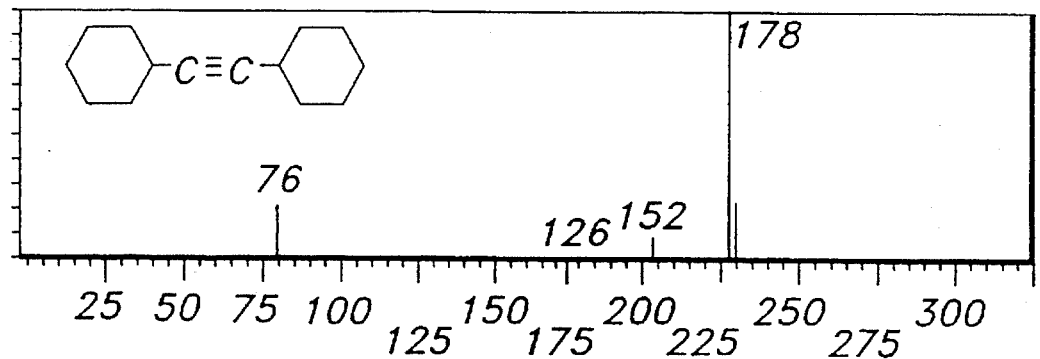

GC-MS measurements of the three benzene soluble fractions presented the same patterns for LSP and LCP and different patterns for LGP. FIGS. 9 and 10 illustrate the GC diagrams for LSP and LCP respectively. A striking similarity can be observed which emphasize the reproducibility of the analytical data and the fact that the metallic nature of the electrodes has a less significant influence on the reaction mechanisms. The presence of a very complex molecular mixture can be seen with a clear predominance of some peaks (54, 109, 122, 151, 164187 and 219). FIGS. 11, 12A–12E, 13A–13G, 14A–14B, and 15A–15E show the possible corresponding chemical structures (isomers included) for GC peaks: 54, 112, 151, 164 and 198, based on Wiley Reference Spectra. Assignments for some of the MS spectra could not be suggested (especially for the higher molecular weight derivatives: MW>200) because of the absence of similar MS patterns in the Wiley database. It is also possible that some of these compounds represent new structures, and their synthesis in conventional ways would be extremely difficult due to the unsaturated nature of the structures. The presence of these structures indicate the development of ring opening and molecular reorganization mechanisms associated with dehydrogenation processes under dense medium plasma conditions.

Figure 16:
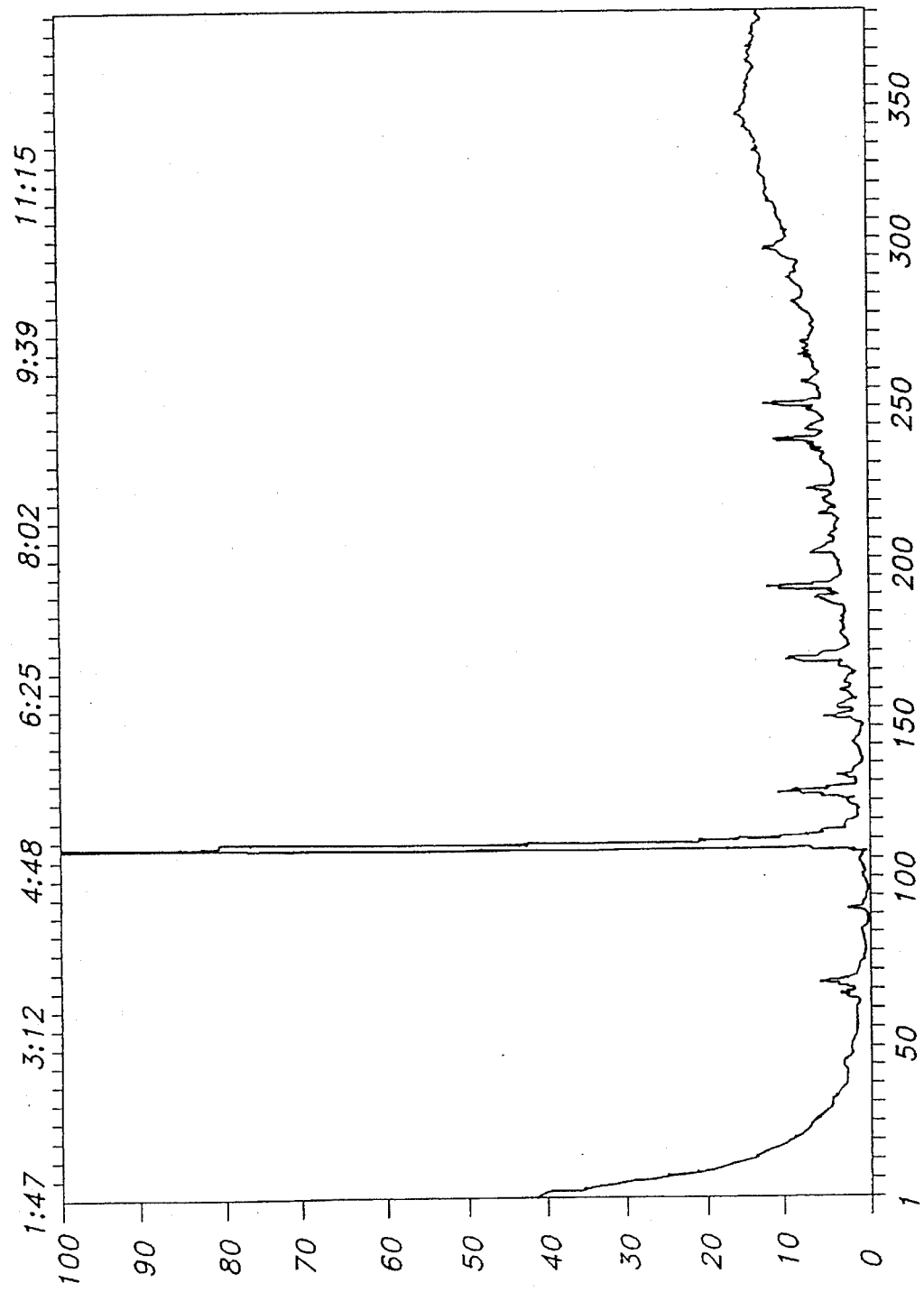
FIG. 16 shows the gas chromatograph diagram for the liquid polymer synthesized by using graphite electrodes (LGP) in the dense phase plasma reactor with benzene as the dense phase reactant material.
Figure 17A:
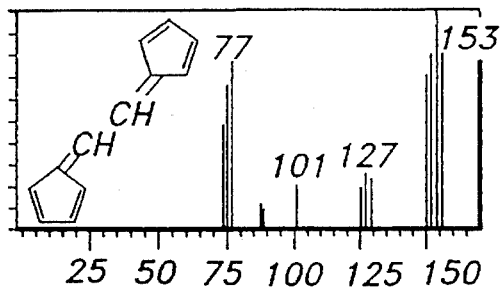
FIGS. 17A–17F, 18, and 19 are the possible corresponding chemical structures (isomers included) for the gas chromatograph peaks shown in FIG. 16.
Figure 17B:
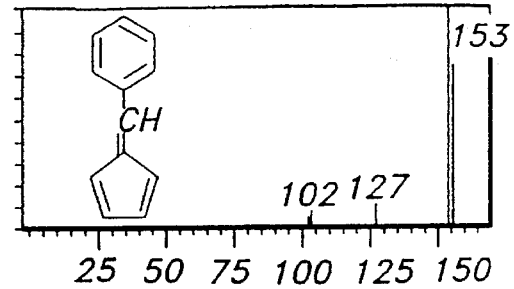
Figure 17C:
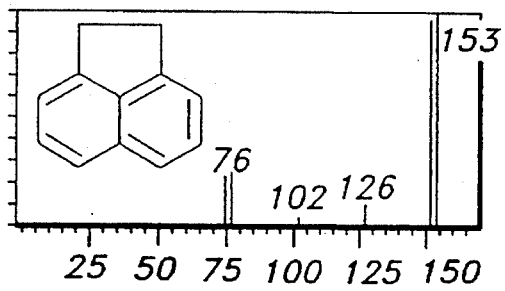
Figure 17D:
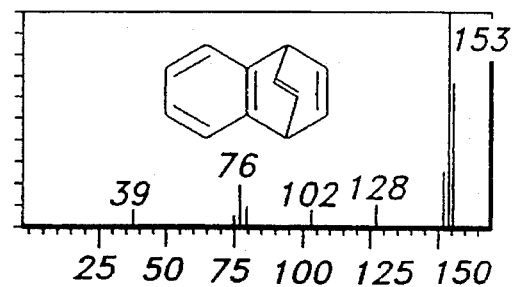
Figure 17E:
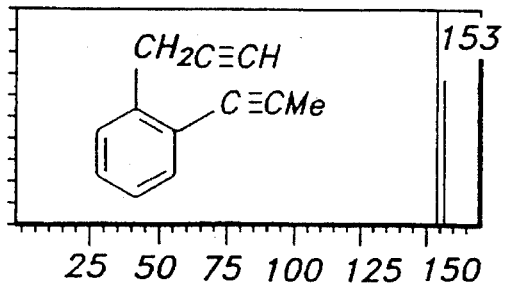
Figure 17F:
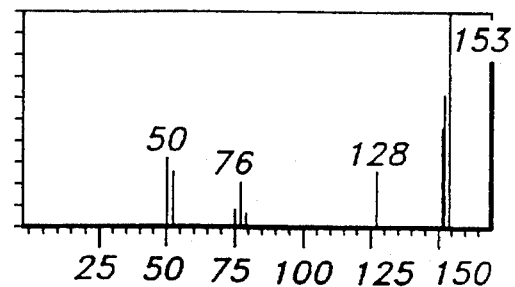
Figure 18:
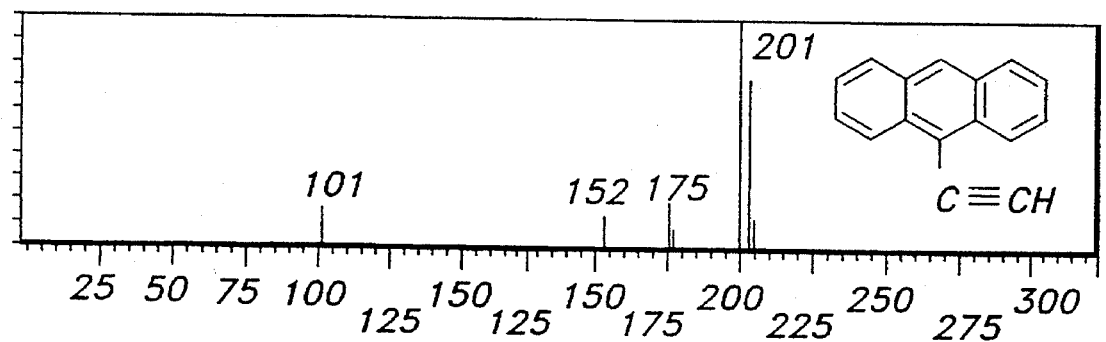
Figure 19:
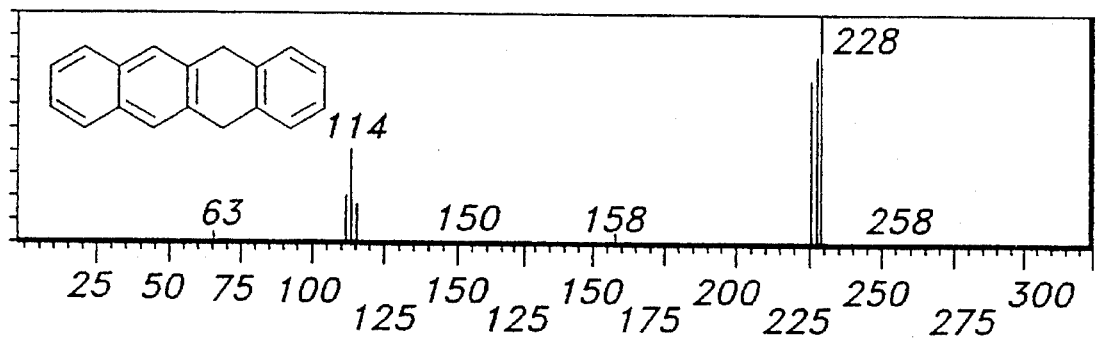

FIG. 16 shows the GC diagram of LGP. It is noteworthy that only one peak (151) is predominant in this case, indicating the existence of a less random mechanism. However, the complex nature of the composition can also be noticed. FIGS. 17A–17F,18, and 19 show the suggested structures (isomers included) based on Wiley MS database. It is interesting to note that the suggested structures for the most predominant peaks (151) also represent major components in the LSP and LCP GC-MS spectra. Once again, these data emphasize the existence of dense medium plasma induced ring opening and molecular reorganization mechanisms associated with dehydrogenation processes regardless of the nature of the electrodes.

The GC-MS data is in agreement with the FT-IR and NMR thereby indicating a strong aromatic character for all of the fractions. The apparent discrepancy between NMR and MS findings (the presence of saturated hydrocarbon chains identified by NMR and the absence of ionic fragments corresponding to hydrocarbon type of structures in MS spectra) can probably be explained by the existence of low volatility higher molecular weight structures being saturated units. These compounds would not be released from the GC column at the adapted temperature range.

Summary of Results

Two reaction products were obtained. The solid reaction product exhibited magnetic properties. The solid material is believed to be a partly dehydrogenated, polyene-polyene type copolymeric structure built up of $-CH=CH-$, $-CH=C-$ and $-C\equiv C-$ units, representing a polyfreeradical system. The liquid reaction product contained a high molecular weight polymer and a variety of aromatic structures, different from benzene, bearing unsaturated side groups. The possible presence of saturated side chains in the high molecular weight structures is also suggested. All of these compounds were formed by ring opening and molecular reorganization mechanisms of benzene. Since the high frequency electromagnetic radiation was essentially totally absorbed or reflected, electron spin resonance spectra were not recordable for the SP (solid polymer synthesized by using stainless steel electrodes) and GP (solid polymer synthesized using by using graphite electrodes) solid reaction products. Mass spectrometry indicated the presence of polyene-polyene type structures.

EXAMPLE 2

(Plasma Reactions of Suspended Polymers)

The reaction vessel of the dense medium plasma reactor was cooled and the inert gas argon was introduced into the reaction vessel and slowly vented to achieve low temperature and atmospheric pressure conditions. Lignin and polyvinylchloride powders each suspended in tetrahydrofuran were loaded into the reaction vessel in the ratio of 70% lignin to 30% polyvinylchloride.

The upper electrode contained in the reaction vessel was rotated at a speed of approximately 4,000–5,000 revolutions per minute and a direct current of 30–40 Volts was applied to the upper planar electrode face. The resulting current was in the rage of 3–4 Amps and the reaction was carried out for ten minutes. Pure tetrahydrofuran was reacted under similar conditions for comparative reasons.

Preliminary data indicate an improved compatibility between the treated lignin and polyvinylchloride under dense medium plasma conditions in comparison to the untreated mixture.

EXAMPLE 3

(Plasma Reaction of Crude Petroleum)

Benzene, which is one of the important components of crude oil, has already been reacted under dense medium plasma conditions as previously described above in Example 1. Unique reaction products were obtained. Ongoing experiments are presently being conducted which involve the reaction of Louisiana crude oil under dense medium plasma conditions.

Finally, the reaction of polyethylene and xylene under dense medium plasma conditions using the dense medium plasma reactor is contemplated. Such a reaction is believed to achieve unique reaction products as previously described.

While preferred embodiments of the invention have been shown and described, it will be apparent to those skilled in this art that various modifications may be made in these embodiments without departing from the spirit of the present invention. Therefore, all suitable modifications and equivalents fall within the scope of the invention.

What is claimed is:

1. An apparatus for reacting dense-phase chemicals in an induced plasma state comprising:
   (a) a reaction vessel having a first upper end, a second lower end, and side walls to define an enclosed area;
   (b) a rotatable first electrode comprising a hollow shaft having first and second ends wherein said first electrode extends through the first end of said reaction vessel such that the second end of said first electrode is positioned near an interior center of the reaction vessel;
   (c) a static second electrode comprising a hollow shaft having first and second ends wherein said second electrode extends through the second end of said reaction vessel such that the second end of said second electrode is positioned near an interior center of the reaction vessel;
   (d) means for rotating said rotatable first electrode; and
   (e) means for connecting space within said hollow shaft of said first electrode to said enclosed area of said reaction.

2. The apparatus of claim 1 further comprising a reactant recirculation conduit extending from a location near the second end of the reaction vessel to a location near the first end of the reaction vessel.

3. The apparatus of claim 1 further comprising means for introducing and venting a reactive gas.

4. The apparatus of claim 1 further comprising means for maintaining the enclosed area within the reaction vessel at atmospheric pressure.

5. The apparatus of claim 4 wherein said means for maintaining the enclosed area within the reaction vessel at atmospheric pressure comprises:
   (a) a positive gas supply introduced into the reaction vessel through an opening in the first end of said static second electrode; and
   (b) a gas vent extending from the first upper end of said reaction vessel.

6. The apparatus of claim 1 further comprising means for cooling any contents contained in said reaction vessel.

7. The apparatus of claim 6 wherein the side walls of said reaction vessel comprise double walls having a space therebetween.

8. The apparatus of claim 7 wherein said means for cooling the contents of the reaction vessel comprises:

(a) a cooling agent located in the space between said double walls of said reaction vessel; and (b) means for circulating said cooling agent throughout said space.

9. The apparatus of claim 8 further comprising at least one thermostat for monitoring and controlling the temperature of the contents contained within the reaction vessel.

10. The apparatus of claim 1 wherein the reaction vessel has a cross-sectional area which is larger than a surface area of the disk-shaped planar faces of the rotatable first electrode and the static second electrode thereby providing for a space located between an edge of the disk-shaped planar faces and the side walls of the reaction vessel.

11. The apparatus of claim 10 wherein said means for connecting space within said hollow shaft of said first electrode to said enclosed area of said reaction vessel comprises a plurality of ports located circumferentially about said hollow shaft of said first electrode.

12. The apparatus of claim 11 wherein said rotatable first electrode and said static second electrode are comprised of one of the group consisting of stainless steel, copper, graphite, silver, platinum, and nickel.

13. An apparatus for reacting dense-phase chemicals in an induced plasma state comprising:

(a) a cylindrical shaped reaction vessel having a first upper end, a second lower end, and double side walls defining a space therebetween;

(b) a rotatable first electrode extending through the first upper end of said reaction vessel and comprising a first cylindrical hollow shaft having a plurality of circumferential ports located therethrough, a first closed end, and a second open end located within the reaction vessel, said second open end terminating in a planar face having a larger diameter than said first cylindrical hollow shaft wherein an opening in said second open end is located in the center of said planar face and has a diameter equal to an internal diameter of the first cylindrical hollow shaft;

(c) a static second electrode extending through the bottom end of said reaction vessel and comprising a second cylindrical hollow shaft having a first open end and a second open end located within the reaction vessel, said second open end terminating in a planar face having a larger diameter than said second cylindrical hollow shaft wherein an opening in said second open end of said second cylindrical hollow shaft is located in the center of said planar face of said second cylindrical hollow shaft and has a diameter equal to an internal diameter of the second cylindrical hollow shaft; and (d) means for rotating said rotatable first electrode; wherein said rotatable first electrode and said static second electrode are in direct vertical alignment with one another such that the planar faces of said first and second hollow cylindrical shafts are positioned directly opposite one another and separated by a planar gap.

14. The apparatus of claim 13 wherein said first and second hollow cylindrical shafts are equal in diameter, said planar faces of the second ends of said first and second hollow cylindrical shafts are of equal diameter, and a diameter of said reaction vessel is larger than the equal diameters of said planar faces.

15. The apparatus of claim 13 wherein said rotatable first electrode and said static second electrode are comprised of one of the group consisting of stainless steel, copper, graphite, silver, platinum, and nickel.

16. The apparatus of claim 13 further comprising a reactant recirculation conduit extending from a location near the second end of the reaction vessel to a location near the first end of the reaction vessel.

17. The apparatus of claim 13 further comprising means for maintaining any contents of said reaction vessel at a high pressure.

18. The apparatus of claim 13 further comprising means for maintaining any contents of said reaction vessel at atmospheric pressure.

19. The apparatus of claim 18 wherein said means for maintaining the reaction vessel contents at atmospheric pressure comprises:

(a) a positive gas supply introduced into said reaction vessel through said first open end of said second cylindrical hollow shaft; and (b) a gas vent extending from the first end of said reaction vessel.

20. The apparatus of claim 13 further comprising means for cooling any contents contained in said reaction vessel.

21. The apparatus of claim 20 wherein said means for cooling the reaction vessel contents comprises:

(a) a cooling agent located in the space between said double walls of the reaction vessel; and (b) means for circulating said cooling agent throughout said space.

22. The apparatus of claim 20 further comprising at least one thermostat for monitoring and controlling a temperature of the contents contained within the reaction vessel.

\* \* \* \* \*